United States Patent
Scott et al.

(10) Patent No.: US 6,175,518 B1
(45) Date of Patent: Jan. 16, 2001

(54) REMOTE REGISTER HIERARCHY ACCESSIBLE USING A SERIAL DATA LINE

(75) Inventors: Anne P Scott, Fort Collins; Jeffrey C Brauch, Ft. Collins; Jay Fleischman, Fort Collins, all of CO (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/281,612

(22) Filed: Mar. 30, 1999

(51) Int. Cl.[7] .................................................. G11C 19/00
(52) U.S. Cl. ............................ 365/78; 365/219; 365/221
(58) Field of Search ............................. 365/78, 219, 221, 365/238, 189.12, 189.01

(56) References Cited

U.S. PATENT DOCUMENTS 5,644,609 * 7/1997 Bockhaus et al. ........................ 377/64
6,009,539 * 12/1999 Ranson .................................... 714/30

* cited by examiner

*Primary Examiner*—David Nelms
*Assistant Examiner*—Hoai V. Ho
(74) *Attorney, Agent, or Firm*—Kevin M. Hart

(57) ABSTRACT

Apparatus and method for accessing numerous remote registers on an integrated circuit chip using a minimum of interconnect traces. Plural primary nodes are configured in series along a serial data line, each of the plural primary nodes individually selectable according to a primary address presented on the serial data line. In one embodiment, a hierarchical one of the plural primary nodes includes plural secondary registers, each of the plural secondary registers individually selectable according to a secondary address presented on the serial data line. In another embodiment, a hierarchical one of the plural primary nodes includes plural secondary nodes, each of the plural secondary nodes individually selectable according to a secondary address presented on the serial data line. At least one of the plural secondary nodes includes plural tertiary registers, each of the plural tertiary registers individually selectable according to a tertiary address presented on the serial data line.

23 Claims, 15 Drawing Sheets

REMOTE REGISTER HIERARCHY ACCESSIBLE USING A SERIAL DATA LINE

FIELD OF THE INVENTION

This invention relates to digital integrated circuits, and more particularly to an apparatus and method for accessing numerous remote registers on an integrated circuit chip using a minimum of interconnect traces.

BACKGROUND

FIG. 1 illustrates a system of registers 100 implemented on an integrated circuit chip according to the teachings of U.S. Pat. No. 5,644,609 (hereinafter "the '609 patent"). The '609 patent issued Jul. 1, 1997, to John Bockhaus et al., is assigned to Hewlett-Packard Company, and is hereby incorporated by reference in its entirety. System of registers 100 includes staging register block 102 and a series of 32 remote register blocks 104–114. A serial data line 116 exits staging register block 102 from a serial data output, propagates through each of the 32 remote register blocks in the series, and then reenters staging register block 102 at a serial data input. A control signal line 118 exits staging register block 102 from a control signal output and propagates through each of the 32 remote register blocks to the last remote register block in the series. Each of remote register blocks 104–114 contains a single remote data register that is associated with a unique address from ADR0 to ADR31, as shown.

In operation, staging register block 102 generates a header containing a it 5-bit address for selecting one of the 32 remote registers to read data from or write data to, and also containing a R/$\overline{W}$ bit for indicating whether a read or a write operation is desired. Using control line 118 and serial data line 116, staging register block 102 propagates this header through the series of remote register blocks so that each remote register block may determine if it has been selected. When a remote register block determines if it has been selected, it shifts data from its remote register onto serial data line 116 in the event the header indicated that a read operation was requested, or it shifts data into its remote register in the event the header indicated that a write operation was requested. Each remote register block in the series represents a one-bit delay in the loop.

Staging register block 102 is coupled to a microprocessor general purpose register or registers 101 via a parallel data path 120. Special microprocessor instructions are used to read from and write to the remote registers distributed throughout the chip. For writes, one microprocessor instruction is used to load the write data into general purpose microprocessor register 101, and another microprocessor instruction (having as its operand the address of the remote register to be written) is executed to shift the address and data through the series of remote register blocks to effect the write. For reads, a microprocessor instruction (having as its operand the address of the remote register to be read) is executed to shift a header containing the desired read address through the series of remote register blocks and back into staging register block 102. Because the selected remote register block will have placed the desired data onto the serial data line in response to the header, the read data will have been clocked into the staging register block on the serial data line at the completion of the read operation.

The teachings of the '609 patent represent an advancement of the art with regard to reducing the number of interconnect traces required to access remote registers on an integrated circuit chip. Further advancements are needed, however, if the system disclosed in the '609 patent is to be extended in an efficient manner. Specifically, it would be desirable to be able to access more than 32 remote registers via staging register block 102 and remote register blocks 104–114. The '609 patent teaches, at column 7, lines 9–13, that this may be done "simply by adding to or subtracting from the number of bits used in the header address field (bits AD0–4)." Such a solution would entail at least three significant drawbacks: First, for each bit added to the header address field, an additional clock would be required for every read or write shifting operation. Second, for each remote register block added to the series, an additional bit of latency would be added to the chain. Third, every remote register block in the series—not just the newly-added remote register blocks beyond the original 32—would have to be redesigned to accommodate the new address field length in the header.

It is therefore an object of the present invention to provide a mechanism for accessing more than 32 remote registers via series 104–114 without changing the length of the header address field (bits AD0–4), without adding one bit of latency for every register beyond the original 32, and without redesigning each of the remote register circuitry blocks in the series.

SUMMARY OF THE INVENTION

The invention includes numerous aspects, each of which contributes to achieving the above-stated objectives.

In one aspect, hierarchical secondary registers may be implemented on an integrated circuit chip as follows: Plural primary nodes are configured in series along a serial data line, each of the plural primary nodes individually selectable according to a primary address presented on the serial data line. A hierarchical one of the plural primary nodes includes: plural secondary registers, each of the plural secondary registers individually selectable according to a secondary address presented on the serial data line; circuitry for communicating data from a selected one of the plural secondary registers to the serial data line during a read operation; and circuitry for communicating data from the serial data line to the selected one of the plural secondary registers during a write operation.

Method steps used to write data to one of the secondary registers may include: presenting a primary address on the serial data line, the primary address for selecting a target primary node out of the plural primary nodes configured in series along the serial data line; presenting a secondary address on the serial data line, the secondary address for selecting a target secondary register out of the plural secondary registers associated with the target primary node; and presenting data on the serial data line to be written into the target secondary register.

Method steps used to read data from one of the secondary registers may include: at a first location, presenting a primary address on the serial data line, the primary address for selecting a target primary node out of the plural primary nodes configured in series along the serial data line; at the first location, presenting a secondary address on the serial data line, the secondary address for selecting a target secondary register out of the plural secondary registers associated with the target primary node; and, at a second location, presenting data from the target secondary register on the serial data line.

In another aspect, hierarchical tertiary registers may be implemented on an integrated circuitry chip as follows: Plural primary nodes are configured in series along a serial data line, each of the plural primary nodes individually selectable according to a primary address presented on the serial data line. A hierarchical one of the plural primary nodes includes plural secondary nodes, each of the plural secondary nodes individually selectable according to a secondary address presented on the serial data line. At least one of the plural secondary nodes includes: plural tertiary registers, each of the plural tertiary registers individually selectable according to a tertiary address presented on the serial data line; circuitry for communicating data from a selected one of the plural tertiary registers to the serial data line during a read operation; and circuitry for communicating data from the serial data line to the selected one of the plural tertiary registers during a write operation.

Method steps used to write data to one of the tertiary registers may include: presenting a primary address on the serial data line, the primary address for selecting a target primary node out of the plural primary nodes configured in series along the serial data line; presenting a secondary address on the serial data line, the secondary address for selecting a target secondary node out of the plural secondary nodes associated with the target primary node; presenting a tertiary address on the serial data line, the tertiary address for selecting a target tertiary register out of the plural tertiary registers associated with the target secondary node; and presenting data on the serial data line to be written into the target tertiary register.

Method steps used to read data from one of the tertiary registers may include: at a first location, presenting a primary address on the serial data line, the primary address for selecting a target primary node out of the plural primary nodes configured in series along the serial data line; at the first location, presenting a secondary address on the serial data line, the secondary address for selecting a target secondary node out of the plural secondary nodes associated with the target primary node; at the first location, presenting a tertiary address on the serial data line, the tertiary address for selecting a target tertiary register out of the plural tertiary registers associated with the target secondary node; and, at a second location, presenting data from the target tertiary register on the serial data line.

The invention provides numerous benefits and advantages. For example, because the secondary and tertiary addresses of the invention are placed within the data field of the standard packet defined by the prior art, the hierarchical nodes of the invention may be included in a loop that includes prior art non-hierarchical nodes. In such an embodiment, the non-hierarchical nodes may be accessed in exactly the same manner as is taught by the prior art, while only the hierarchical nodes need by accessed in the manner taught herein. Thus, prior art non-hierarchical nodes need not be redesigned in order to be used in connection with the hierarchical nodes of the invention. Moreover, the hierarchical nodes of the invention allow many registers to be added to a system without adding bits of latency to the loop for each register so added. Other benefits and advantages of the invention will become apparent to those having skill in the art and having reference to this specification.

BRIEF DESCRIPTION DRAWINGS

DETAILED DESCRIPTION OF THE PREFERRED EMBODIMENTS

Overview (FIGS. 2–5)

Figure 1:
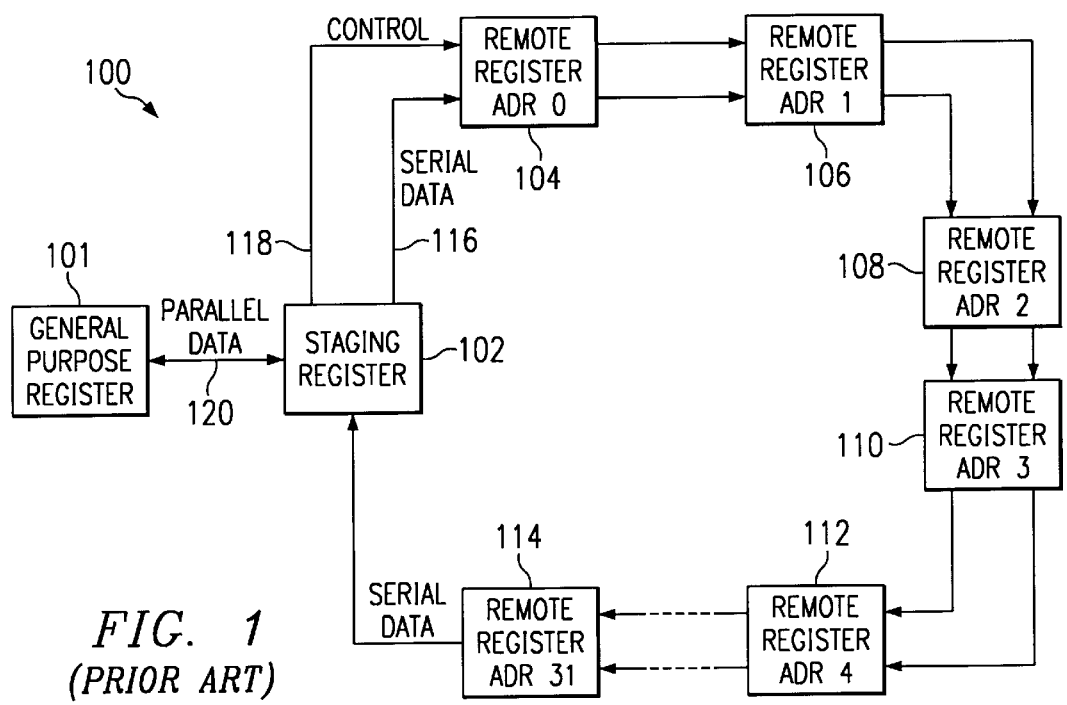
FIG. 1 is a block diagram illustrating a prior art technique for accessing multiple remote registers on an integrated circuit chip.
Figure 2:
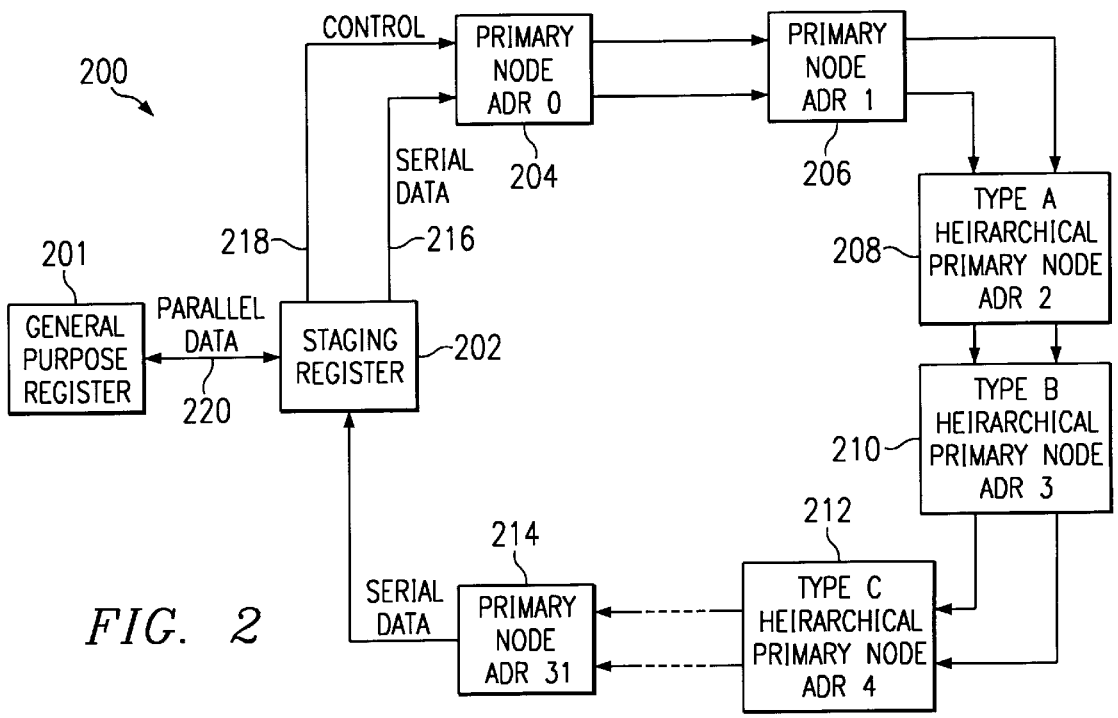
FIG. 2 is a block diagram illustrating an improved technique for accessing multiple remote/registers on an integrated circuit chip using hierarchical nodes according to /referred embodiment of the invention.

FIG. 2 illustrates a system of registers 200 implemented on an integrated circuit chip according to a preferred embodiment of the invention. 32 primary nodes 204–214 are configured in series along serial data line 216 and control line 218. Each of the 32 primary nodes 204–214 is associated with a unique primary address from ADR(0) to ADR(31) as shown. Physically, system of registers 200 is the same as system of registers 100 shown in FIG. 1 except for the presence of three new node types: type A hierarchical primary node 208, type B hierarchical primary node 210 and type C hierarchical primary node 212. Primary nodes 204, 206 and 214 are conventional nodes identical to the remote register blocks shown in FIG. 1. According to the invention, any number of instances of type A, B and C hierarchical nodes may be intermingled with conventional nodes in any combination subject to a maximum of 32 total primary nodes per series. It will be assumed herein for purposes of illustration that general purpose register block 201, parallel data bus 220 and staging register block 202 are implemented exactly as described in the '609 patent at FIGS. 2A–2B and the accompanying text. Specifically, it will be assumed that every read or write cycle executed on system of registers 200 will use a standard 71-bit packet containing a 7-bit header and a 64-bit data field. This assumption is not intended to limit the scope or applications of the invention, however, to those specific address and data field widths. In other implementations, longer or shorter address and data field widths may by used to create a standard packet containing more or fewer than 71 total bits and a series containing more or fewer than 32 total primary nodes.

Figure 3:
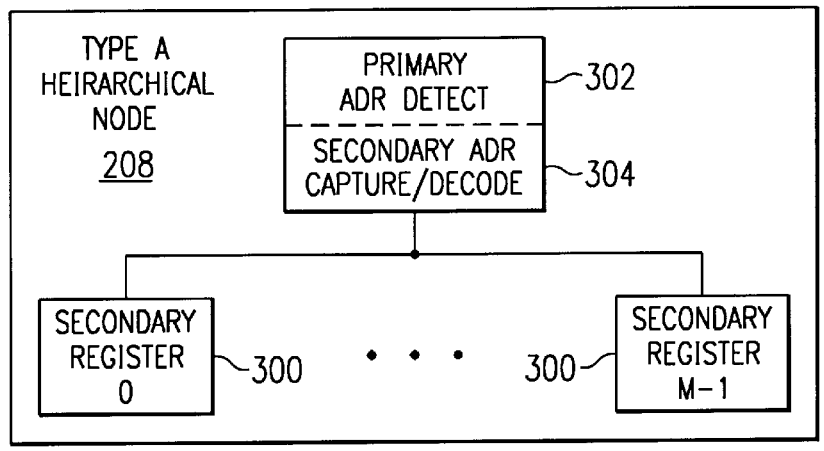
FIG. 3 is a block diagram illustrating the type A hierarchical primary node of FIG. 2 in more detail.

FIG. 3 generically illustrates type A hierarchical primary node 208. Type A hierarchical primary node 208 contains m secondary registers 300. Hierarchical node 208 is selected by primary address detect circuitry 302 responsive to the 5 address bits that are included in the 7-bit header of the standard 71-bit packet taught in the '609 patent. But each of the m secondary registers within node 208 is individually selectable by secondary address capture/decode circuitry 304 responsive to the first $\log_2 m$ bits of the 64-bit data field that is included in the standard 71-bit packet. An example implementation of type A hierarchical primary node 208 will be described below in detail.

Figure 4:
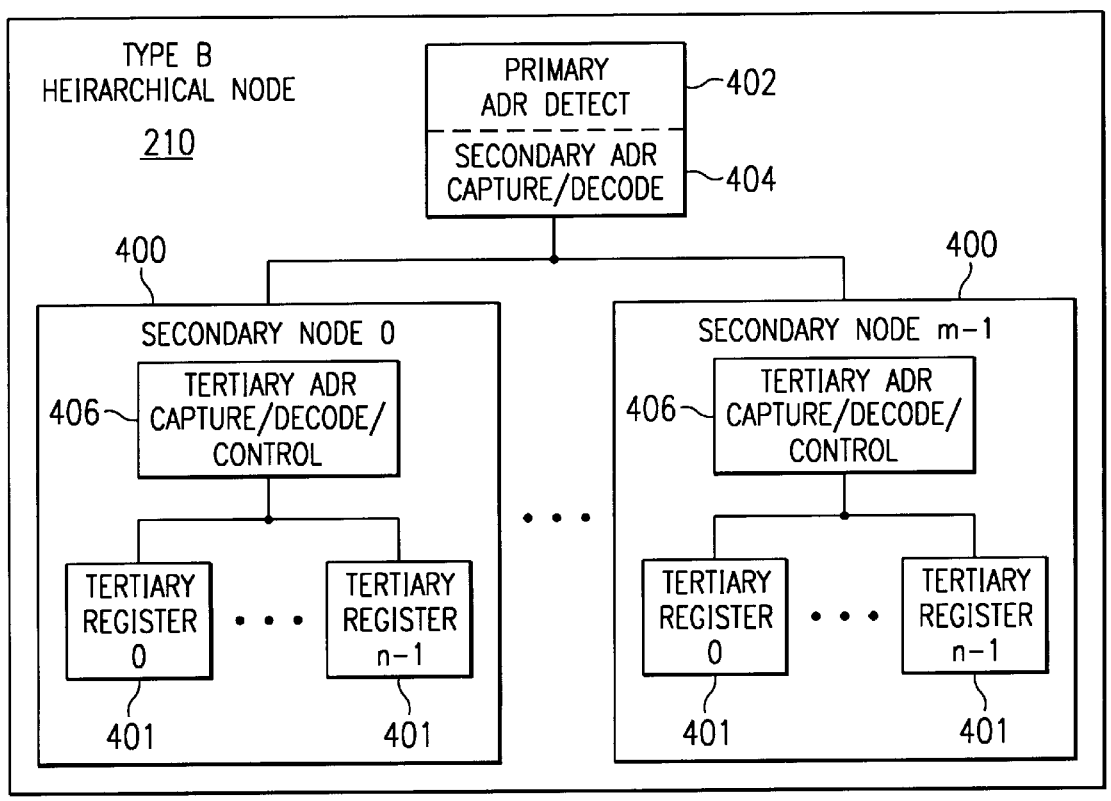
FIG. 4 is lock diagram illustrating the type B hierarchical primary node of FIG. 2 in more detail.

FIG. 4 generically illustrates type B hierarchical primary node 210. Type B hierarchical primary node 210 contains m secondary nodes 400. Each of the m secondary nodes 400 contains n tertiary registers 401. Hierarchical node 210 is selected by primary address detect circuitry 402 responsive to the 5 address bits that are included in the 7-bit header of the standard 71-bit packet taught in the '609 patent. Each of the m secondary nodes within node 208 is individually selectable by secondary address capture/decode circuitry 404 responsive to the first $\log_2 m$ bits of the 64-bit data field that is included in the standard 71-bit packet. Within the secondary node so selected, each of the n tertiary registers is individually selectable by tertiary address capture/decode/control circuitry 406 responsive to the $\log_2 n$ bits of the 64-bit data field in the packet following the first $\log_2 m$ bits. An example implementation of type B hierarchical primary node 210 will be described below in detail.

Figure 5:
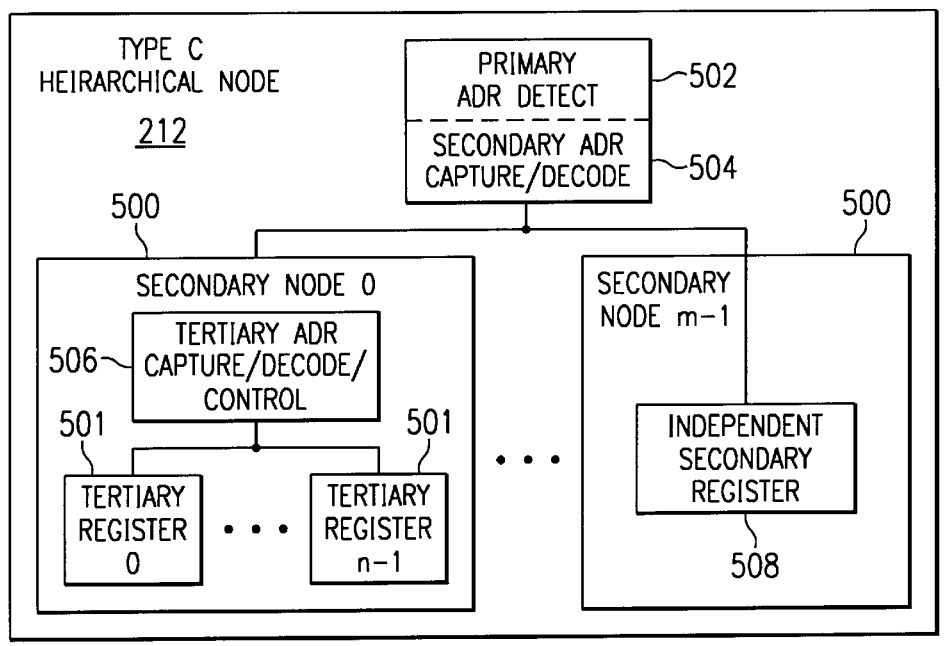
FIG. 5 is a block diagram illustrating the type C hierarchical primary node of FIG. 2 in more detail.

FIG. 5 generically illustrates type C hierarchical primary node 212. As is apparent from the drawing, type C hierarchical primary node 212 is a hybrid of types A and B. Like type A node 208 and type B node 210, type C node 212 is selected by primary address detect circuitry 502 responsive to the 5 address bits that are included in the 7-bit header of the standard 71-bit packet. And like type B node 210, type C node 212 contains m secondary nodes 500, each of which is individually selectable by secondary address capture/decode circuitry 504 responsive to the first $\log_2 m$ bits of the 64-bit data field contained in the standard 71-bit packet. But unlike type B node 210, not all secondary nodes 500 are identical. Some of secondary nodes 500 may be like those of type B node 210, in which n tertiary registers 501 are contained and are individually selectable by tertiary address capture/decode/control circuitry 506 responsive to the $\log_2 n$ bits of the 64-bit data field in the packet following the first $\log_2 m$ bits. Others of secondary nodes 500 may simply contain a single independent secondary register 508. Any combination of these two kinds of secondary nodes 500 may be included in a type C hierarchical primary node. An example implementation of type C hierarchical primary node 212 will be described below in detail.

Type A Hierarchical Primary Node (FIGS. 6–12)

Figure 6:
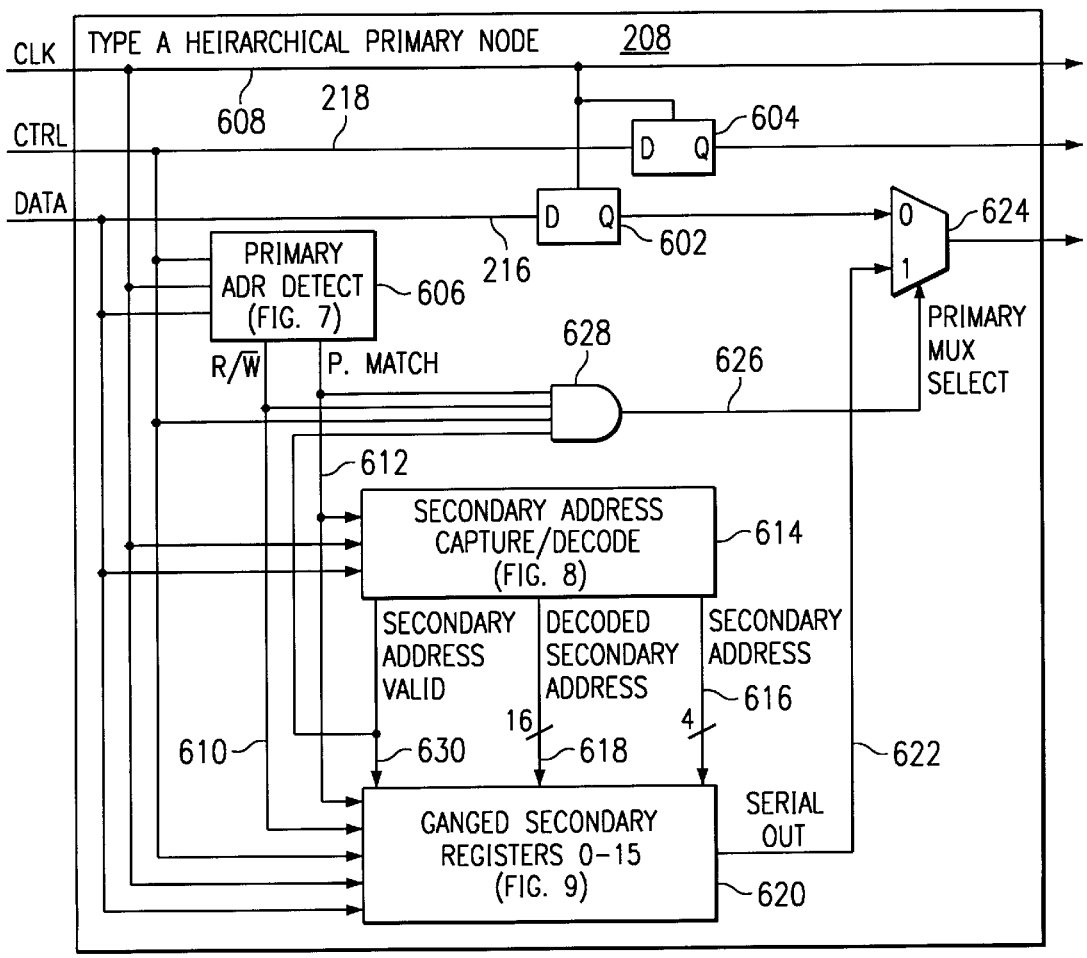
FIG. 6 is a schematic diagram illustrating a preferred implementation for the type A hierarchical primary node of FIG. 3.

An example implementation of type A hierarchical primary node 208 will now be described in detail with reference to FIGS. 6–12. Referring now to FIG. 6, hierarchical node 208 interposes a one-bit latency on serial data line 216 and control line 218 by virtue of storage cells 602 and 604, respectively. Primary address detect block 606 is coupled to serial data line 216, control line 218 and clock signal 608, as shown. Primary address detect block 606 generates $R/\overline{W}$ signal 610 and primary match ("PMatch") signal 612 as outputs. Secondary address capture/decode block 614 is coupled to serial data line 216, clock signal 608 and PMatch signal 612, as shown. Secondary address capture/decode block 614 generates secondary address valid ("S. Adr Valid") signal 630 and drives secondary address ("S.Adr") bus 616 and decoded secondary address ("decoded S.Adr") bus 618. Ganged secondary registers block 620 is coupled to serial data line 216, control line 218, clock signal 608, RIW signal 610, PMatch signal 612, S. Adr Valid signal 630, decoded S. Adr bus 618 and S. Adr bus 616, as shown. Ganged secondary registers block 620 drives serial out line 622. Primary multiplexer 624 is interposed on serial data line 216. Thus, the serial data output of hierarchical node 208 will follow either the state of the output of storage cell 602 or the state of serial out line 622 depending on the state of primary mux select signal 626. Primary mux select signal 626 is the logical AND of S. Adr Valid signal 630, PMatch signal 612, $R/\overline{W}$ signal 610 and control signal 218, as indicated by AND gate 628.

Figure 7:
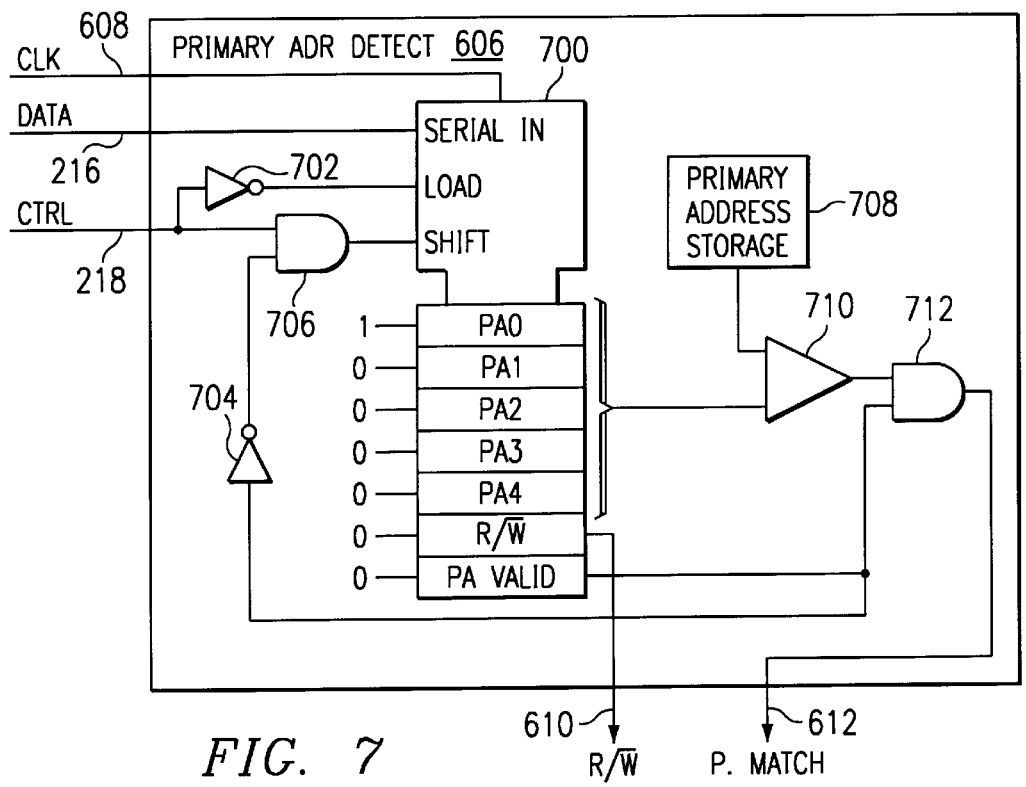
FIG. 7 is a schematic diagram illustrating a preferred implementation for the primary address detect block of FIGS. 6, 13 and 18.

FIG. 7 illustrates primary address detect block 606 in more detail. Shift register 700 has its clock input coupled to clock signal 608 and its serial data input coupled to serial data line 216. It has a load input coupled to an inverted version of control 218 (see inverter 702). Its parallel data load inputs are coupled to binary "1000000," as shown. When control 218 is low, shift register 700 will be loaded with "1000000" on the rising edge of clock 608. After such an initialization, the output of inverter 704 will be high. But the shift input of shift register 700 will still be low because control 218 is still low (see AND gate 706). When control 218 goes high, signing that a read or write operation is starting, the shift input of shift register 700 will go high until the primary address valid ("PA Valid") bit in shift register 700 is high. At that time, shift register 700 will stop shifting, having succeeded in capturing the 7-bit header of the read or write operation. (See the '609 patent for a more detailed discussion of the generation of this 7-bit header.) The first five bits of the header, "PA0–PA4," constitute a primary address. The sixth bit, "$R/\overline{W}$," indicates whether the operation is a read or a write operation. Preferably, a predetermined address is stored in primary address storage block 708 either by programming or hardwiring in order associate hierarchical node 208 with a unique one of the primary addresses from 0 to 31. Comparator 710 compares this stored address with bits PA0–PA4 of shift register 700. The output of comparator 710 is gated with the "PA Valid" bit by AND gate 712, as shown. The output of AND gate 712 provides PMatch signal 612, which signal indicates whether the primary address just captured from serial data line 216 is equal to the address stored in block 708. $R/\overline{W}$ signal 610 simply follows the state of the sixth bit of shift register 700.

Figure 8:
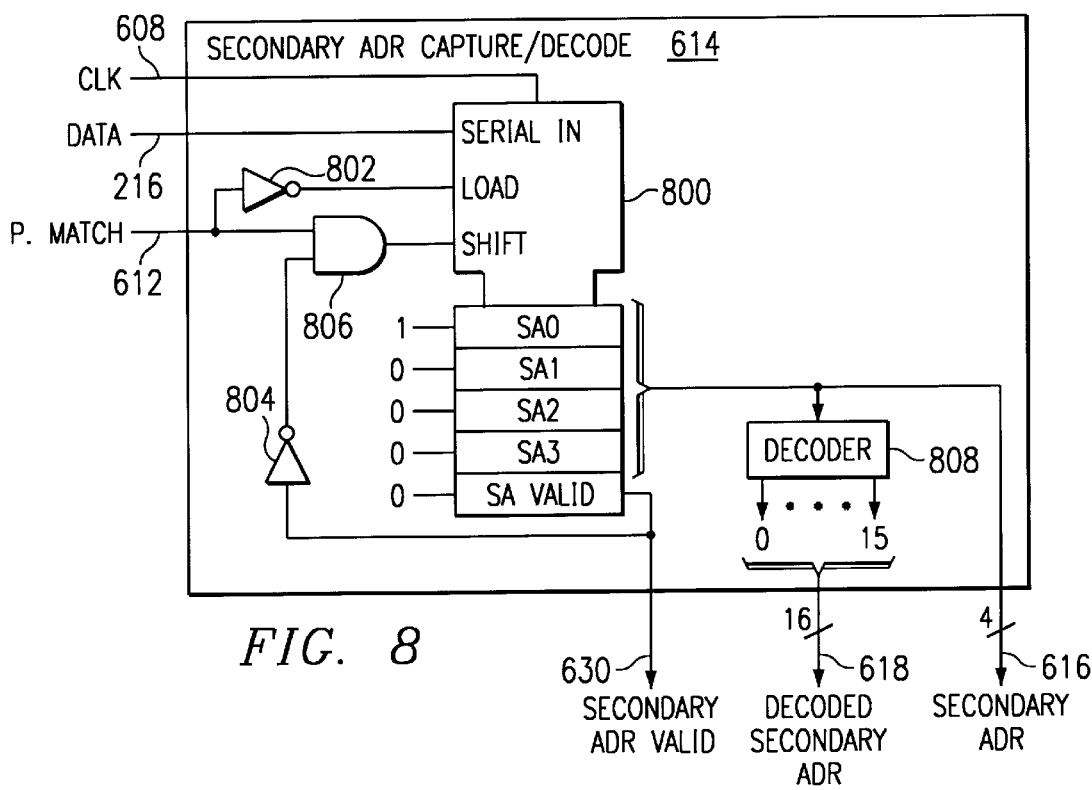
FIG. 8 is a schematic diagram illustrating a preferred implementation for the secondary address capture/decode block of FIGS. 6, 13 and 18.

FIG. 8 illustrates secondary address capture/decode block 614 in more detail. Shift register 800 has its clock input coupled to clock signal 608 and its serial data input coupled to serial data line 216. It has a load input coupled to an inverted version of PMatch 612 (see inverter 802), and its parallel data load inputs are coupled to binary "10000." Thus, when PMatch 612 is low, shift register 800 will be loaded with "10000" on the rising edge of clock 608. After such an initialization, the output of inverter 804 will be high. Thereafter, as soon as PMatch 612 goes high, the shift input of shift register 800 will go high (see AND gate 806), and shift register 800 will shift in the four bits of data from serial data line 216 that immediately follow the 7-bit header. These four bits constitute a secondary address. As soon as the fourth bit of the secondary address has been shifted in, shift register 800 will stop shifting because the "1" that was present in bit 0 will now have been shifted into bit 4, causing the output of inverter 804 and the output of AND gate 806 to go low. Bits 0–3 of shift register 800 (the secondary address) are supplied to S.Adr bus 616, and to the inputs of 4:16 decoder 808. The outputs of decoder 808 drive decoded S.Adr bus 618. S. Adr Valid signal 630 simply follows the state of the last bit of shift register 800.

Figure 9:
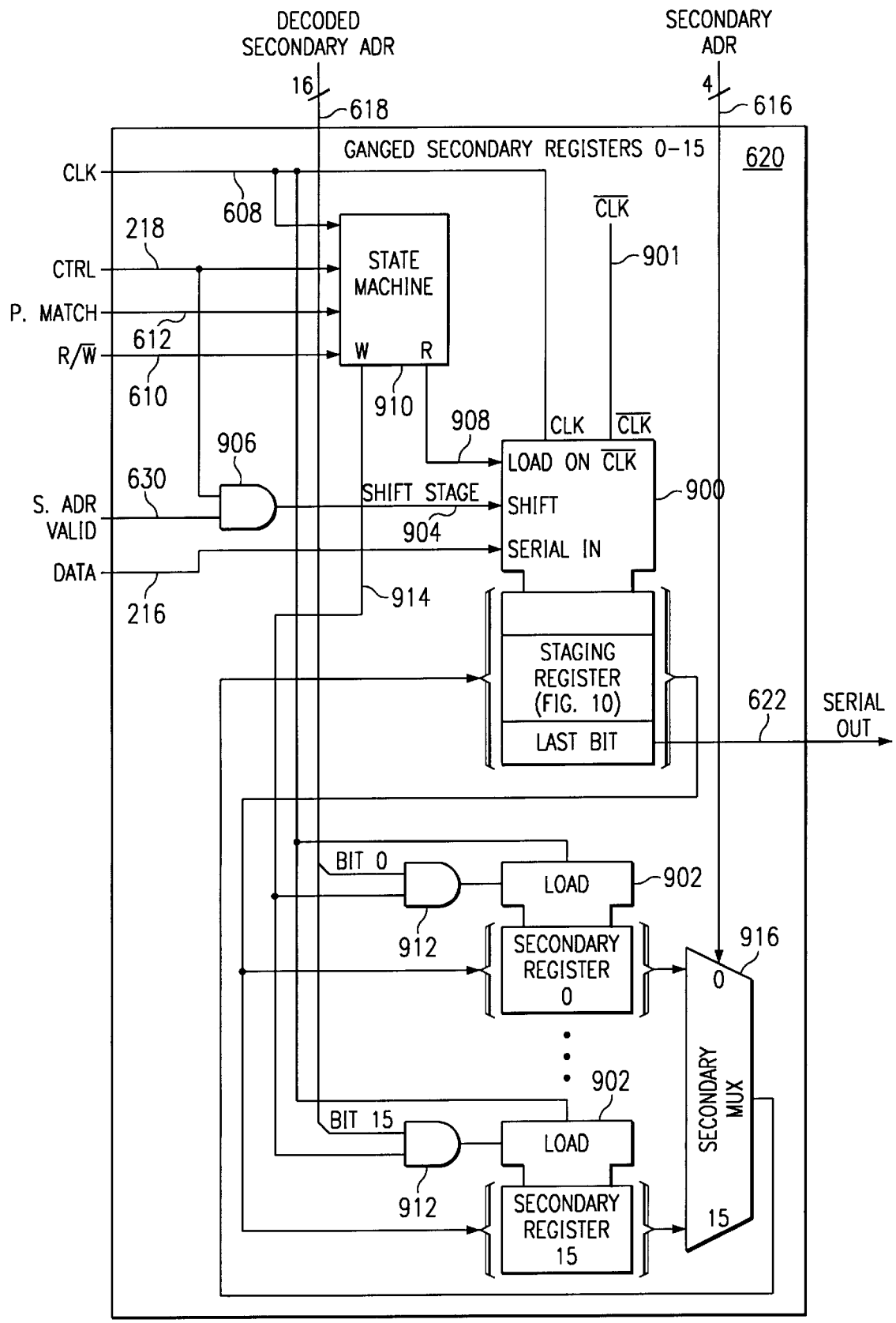
FIG. 9 is a schematic diagram illustrating a preferred implementation for the ganged secondary registers of FIG. 6.

FIG. 9 illustrates ganged secondary registers block 620 in more detail. Staging register 900 is a special type of shift register which will be described in more detail below. It has a first clock input coupled to clock signal 608 and a second clock input coupled to $\overline{\text{clk}}$ signal 901 (the inverse of clock signal 608). It has a serial data input coupled to serial data line 216 and a "load on $\overline{\text{clk}}$" input coupled to read ("R") signal 908, which is generated by state machine 910. The shift input of staging register 900 is coupled to shift stage signal 904, which is the logical AND of control 218 and S. Adr Valid 630 (see AND gate 906). Serial out 622 is taken from the last bit of staging register 900.

Secondary registers 0–15 are implemented with sixteen conventional shift registers 902, as shown. Each shift register 902 has its clock input coupled to clock signal 608. Each has a load input that is coupled to the output of an AND gate 912. Each of AND gates 912 determines the logical AND of write ("W") signal 914, which is produced by state machine 910, and one of the decoded S. Adr bits 618. The parallel data load inputs of all shift registers 902 are coupled to the parallel data outputs of staging register 900. Thus, whenever W signal 914 is high, the contents of staging register 900 are loaded into one of shift registers 902 synchronous with clock 608. The identity of the shift register so loaded is determined by the state of decoded S. Adr bus 618. (These ganged secondary registers 620, as well as the ganged tertiary registers 1328 and independent secondary registers 1840 to be described below, may be used to control other circuitry within the integrated circuit chip. Thus, obviously, the outputs of these registers will be coupled not just to multiplexers 916, 1516 and staging register 1900 respectively, but also to whatever circuitry they are intended to control.)

The parallel data load inputs of staging register 900 are coupled to the output of secondary multiplexer ("mux") 916. Each of the data inputs of secondary mux 916 is coupled to the output of one of shift registers 902. The data selected for output on secondary mux 916 is determined by the state of S. Adr bus 616. When R signal 908 is high, the contents of one of shift registers 902 will be loaded into staging register 900 synchronous with $\overline{\text{clk}}$ 901. The identity of the shift register whose contents are loaded into staging register 900 is determined by the state of S. Adr bus 916.

State machine 910 is coupled to clock signal 608 and has the following inputs: control 218, PMatch 612 and R/$\overline{\text{W}}$ 310. The implementation of state machine 910 will be straightforward to persons having ordinary skill in the art and having reference to this discussion and FIGS. 11 and 12.

Figure 10:
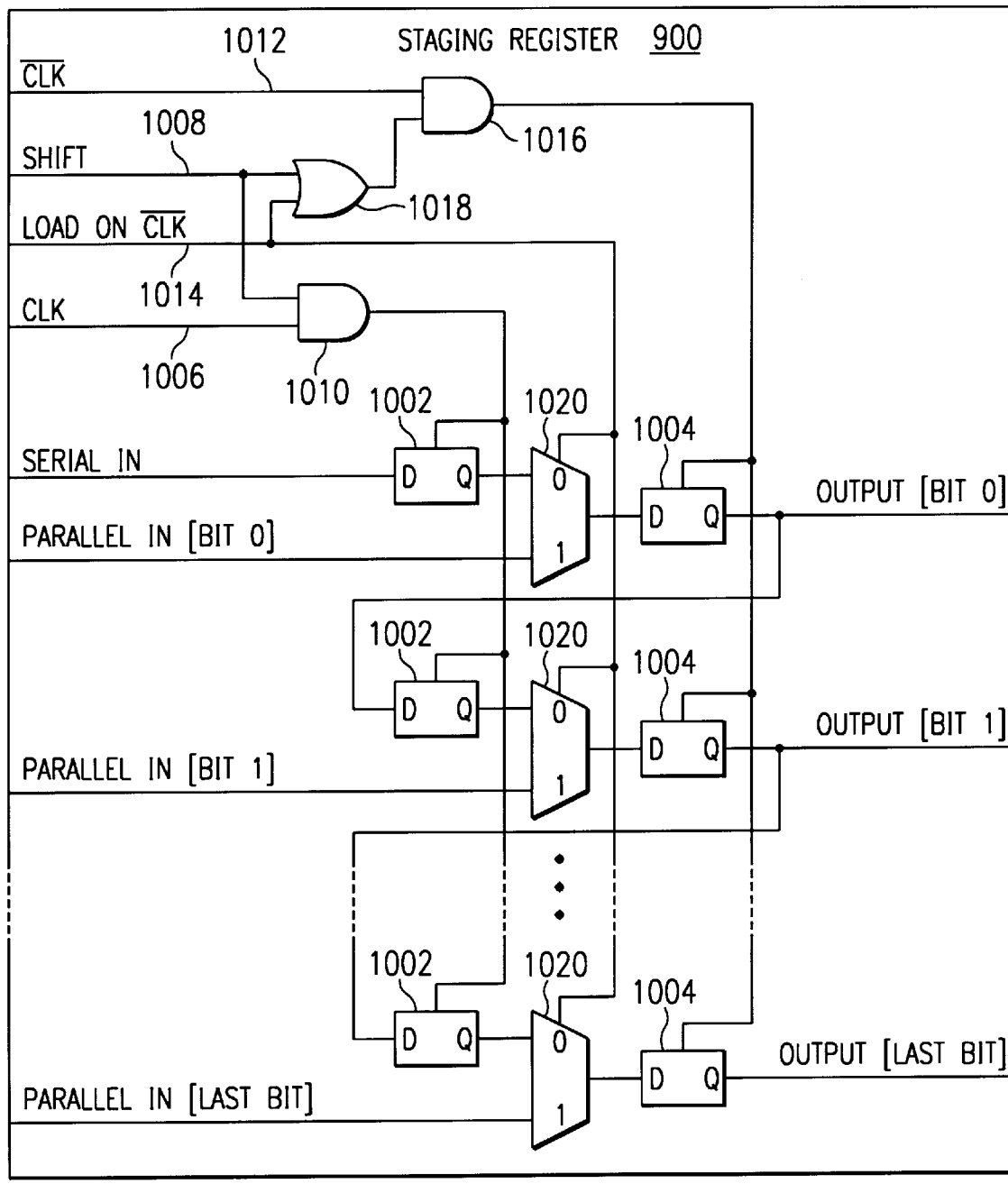
FIG. 10 is a schematic diagram illustrating a preferred implementation for the staging register of FIGS. 9, 15 and 19.

FIG. 10 illustrates staging register 900 in detail. Staging register 900 may contain an arbitrary number of bits as required by the implementation. Two storage cells 1002 and 1004 are associated with each bit. Storage cells 1002 are all triggered on the logical AND of $\overline{\text{clk}}$ input 1006 and shift input 1008 (see AND gate 1010). Storage cells 1004 are all triggered on the logical AND of $\overline{\text{clk}}$ input 1012 and the logical OR of "load on $\overline{\text{clk}}$" input 1014 and shift input 1008 (see AND gate 1016 and OR gate 1018). Because of this arrangement, storage cells 1002 and storage cells 1004 are all active during serial shift operations, but only storage cells 1004 are active during parallel load operations. Storage cells 1002 are synchronous with $\overline{\text{clk}}$ input 1006, while storage cells 1004 are synchronous with $\overline{\text{clk}}$ input 1012. Multiplexers 1020 are controlled by "load on $\overline{\text{clk}}$" input 1014. As long as "load on $\overline{\text{clk}}$" input 1014 is low, the 0 inputs of the multiplexers are selected, thus putting staging register 900 is in serial shift mode. But when "load on $\overline{\text{clk}}$" input 1014 is high, staging register 900 is in parallel load mode.

Prior to discussing read and write timing for any of the hierarchical primary nodes disclosed herein, it will be helpful to note the following: The number of bits in each of the secondary or tertiary registers of system 200 may be more than ("oversized") or less than ("undersized") the maximum number of data bits that can be communicated in a standard 71-bit packet. If a secondary or tertiary register is oversized, then more than one standard packet must be used to write to it or read from it. If a secondary or tertiary register is undersized, then only one standard packet would be required for a read or write, but the programmer must pad the data field appropriately for writes and disregard corresponding data field bits during reads. In the example implementation, it is left to the programmer to know the sizes of all registers in system 200. Thus, it is up to the programmer to know how many cycles will be required to read from or write to a given register; the programmer must setup and execute the required number of cycles.

In order to best illustrate the preferred embodiments of the invention in detail, all of the timing examples given herein (including the examples of FIGS. 11, 12, 16 and 17) assume that an oversized register is being accessed. Furthermore, these examples assume that the oversized register being accessed may be read from or written to using two standard 71-bit packets, or two "cycles."

Figure 11:
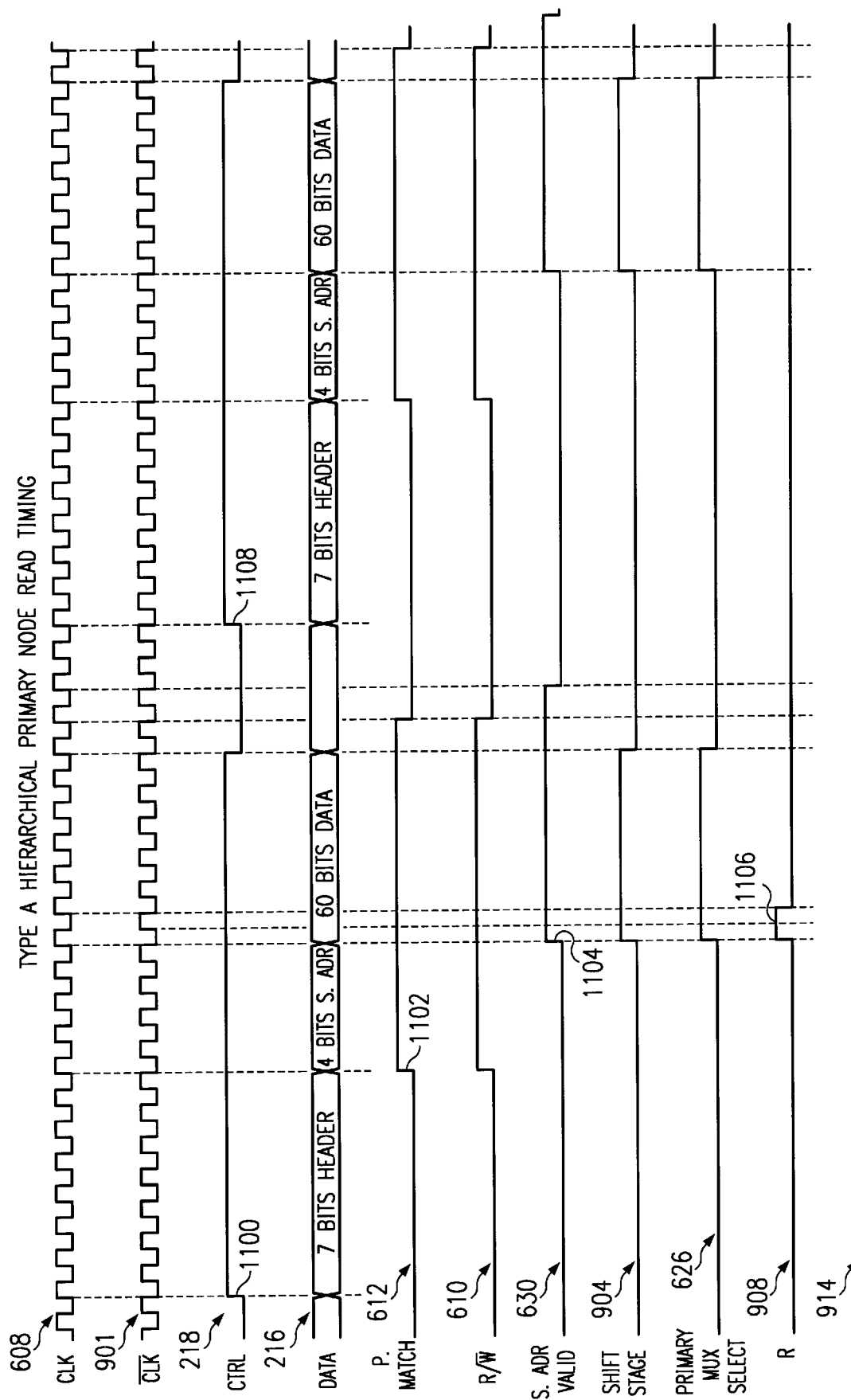
FIG. 11 Is a timing diagram illustrating preferred read timing for the type A hierarchical primary node of FIG. 6.

For a case in which two cycles are required to access an oversized secondary register, FIG. 11 illustrates preferred read timing for type A hierarchical node 208. Microprocessor instructions are used to prepare a header generation register and a staging register within block 202 for each of the two cycles. Prior to beginning cycle 1, the primary address corresponding to primary node 208 is placed in the header generation register within block 202. The secondary address corresponding to the secondary register sought to be read (the "source register") is placed in the first four bits of the staging register within block 202. After this initialization, only 60 bits of data carrying capacity remain in the packet for cycle 1. (By way of contrast, in the teachings of the '609 patent, only the header of the packet carried an address. Thus, every packet was capable of carrying 64 bits of data.)

Cycle 1 begins with the assertion of control line 218 as shown at 1100. At the location of staging register block 202, the contents of the header generation register are shifted onto serial data line 216 during the 7 cycles of clock 608 that immediately follow the assertion of control line 218. At the location of primary node 208, these bits are shifted into shift register 700. As soon as the seventh header bit has been clocked into shift register 700, PMatch 612 becomes asserted as shown at 1102. Also, R/$\overline{\text{W}}$ 610 becomes asserted at this time because this cycle was setup as a read operation. At the location of staging register block 202, the contents of the staging register begin to be shifted onto serial data line 216 as soon as the last bit of the header generation register has been clocked out. Thus, the 4-bit secondary address immediately follows the 7-bit header. At the location of primary node 208, these 4 bits of secondary address are shifted into shift register 800 because PMatch 612 is now asserted. S. Adr valid signal 630 goes high immediately after the fourth secondary address bit has been clocked into shift register 800, as shown at 1104. As soon as S. Adr bus 616 is valid, the contents of the correct source secondary register 902 are presented to the parallel data inputs of staging register 900.

It is the job of state machine 910 to control R signal 908 and W signal 914 during all read and write cycles for primary node 208. (Because the example of FIG. 11 is a read cycle, W signal 914 will remain low for both cycles 1 and 2.) In order for the packets to remain intact, staging register 900 must be parallel load before the rising edge of clock 608 that follows time 1104. To accomplish this, state machine 910 asserts R signal 908 at time 1104 for one cycle of clock 608. Because of the special design of staging register 900, this causes a parallel load at time 1106. Shift stage 904 and primary mux select 626 will be high for 60 cycles of clock 608 beginning at time 1104. This is because the generation of both of those signals includes S. Adr valid 630 and control 218 in the AND term. The result will be that 60 bits from newly-loaded staging register 900 will be clocked onto data line 216 via the output of primary multiplexer 624. Moreover, this is done in a manner that preserves the timing integrity of the 71-bit packet corresponding to cycle 1.

An arbitrary amount of time after cycle 1 ends, cycle 2 begins with another assertion of control signal 218 as shown at 1108. Cycle 2 is identical with cycle 1 except that, in cycle 2, the R signal 908 is never asserted. This is because staging register 900 need only be parallel loaded once at the beginning of a multi-cycle read operation. Thereafter, its contents are merely shifted until all of the bits have been clocked onto data line 216. (It is assumed for the illustrative implementation that staging register 900 is the same size as each of secondary registers 0–15, and that each of secondary registers 0–15 is the same size as one another.) The effect of the two-cycle read operation just described is that 60 bits of data are read from the selected secondary register during each of the two cycles, for a total of 120 bits. After each cycle, it is up to the programmer to retrieve the correct 60 bits from the data field in staging register block 202.

Figure 12:
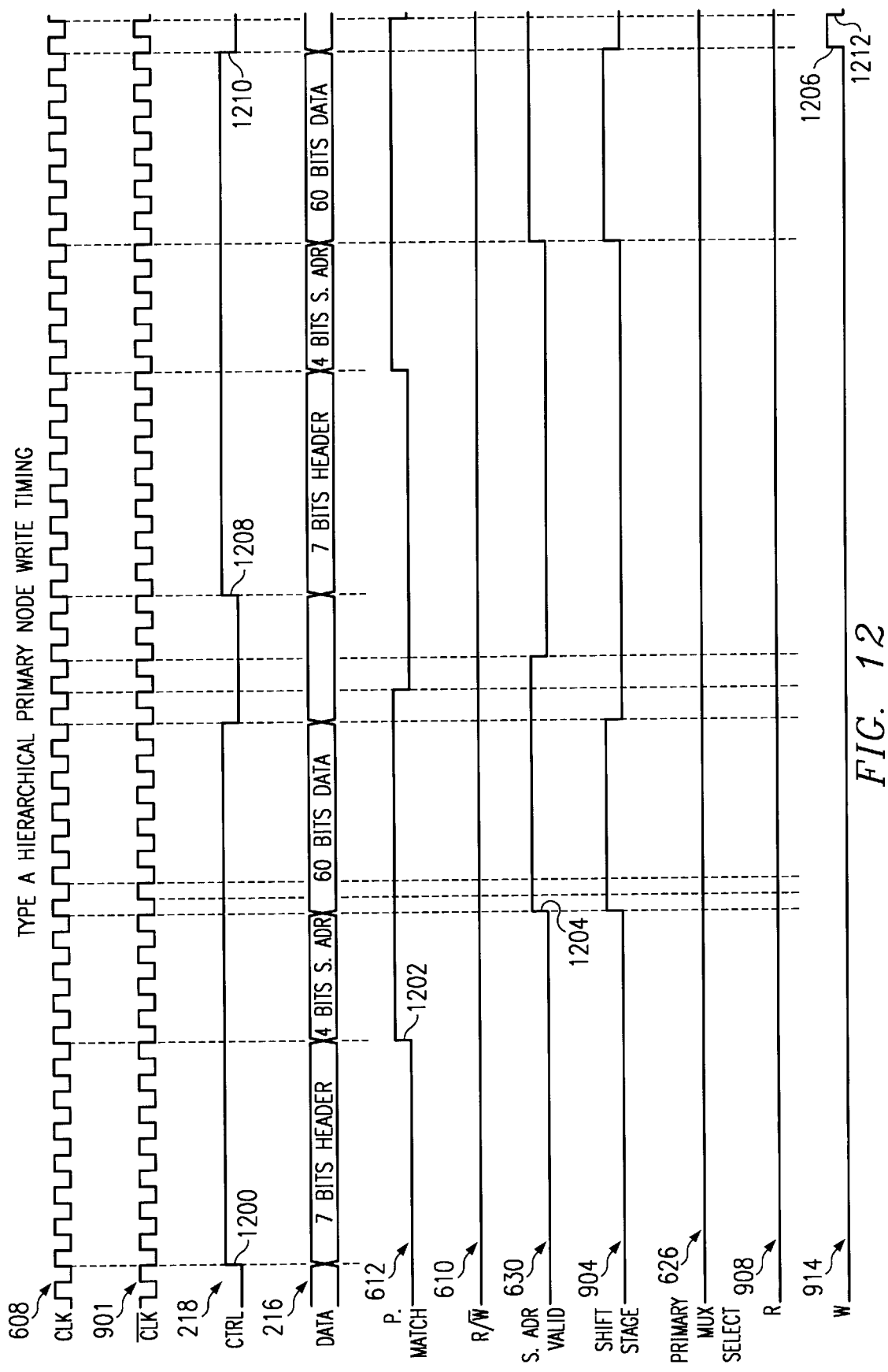
FIG. 12 is a timing diagram illustrating preferred write timing for the type A hierarchical primary node of FIG. 6.

FIG. 12 illustrates preferred write timing for type A hierarchical node 208. Like the example of FIG. 11, the example of FIG. 12 is also for a case in which two cycles are required to access an oversized secondary register. Microprocessor instructions are used to prepare the header generation register and the staging register within block 202 for each of the two cycles. Prior to beginning cycle 1, the primary address corresponding to primary node 208 is placed in the header generation register within block 202. The secondary address corresponding to the secondary register sought to be written (the "target register") is placed in the first four bits of the staging register within block 202. After this initialization, only 60 bits of data carrying capacity remain in the packet for cycle 1.

There are only two noteworthy differences between the write timing of FIG. 12 and the read timing of FIG. 11. First, in FIG. 12, neither the R/W signal 610 nor the R signal 908 are asserted at any time. This is because the timing of FIG. 12 depicts a write operation, not a read operation. Second, a one-cycle pulse occurs on W signal 914 at time 1206. The significance of this pulse is as follows: Because this is a write operation, the last 60 bits of each packet of each cycle will be shifted into staging register 900. At the end of the second cycle, the contents of staging register 900 will be loaded into the one secondary register that was selected by the secondary address bits (the first 4 bits of the 64-bit data field in each packet). The one-cycle pulse on W signal 914 at time 1206 accomplishes this transfer of the contents of staging register 900 into the selected secondary register.

Cycle 1 begins with the assertion of control line 218 as shown at 1200. At the location of staging register block 202, the contents of the header generation register are shifted onto serial data line 216 during the 7 cycles of clock 608 that immediately follow the assertion of control line 218. At the location of primary node 208, these bits are shifted into shift register 700. As soon as the seventh header bit has been clocked into shift register 700, PMatch 612 becomes asserted as shown at 1202. At the location of staging register block 202, the contents of the staging register begin to be shifted onto serial data line 216 as soon as the last bit of the header generation register has been clocked out. At the location of primary node 208, these 4 bits of secondary address are shifted into shift register 800 because PMatch 612 is now asserted. S. Adr valid signal 630 goes high immediately after the fourth secondary address bit has been clocked into shift register 800, as shown at 1204. As soon as S. Adr valid 630 goes high, 60 bits of data are shifted into staging register 900.

An arbitrary amount of time after cycle 1 ends, cycle 2 begins with another assertion of control signal 218 as shown at 1208. Cycle 2 then proceeds in a manner identical with that of cycle 1, with the aggregate result that 120 data bits will have been shifted into staging register 900. Immediately after control 218 goes low at time 1210 signifying the end of cycle 2, state machine 910 asserts W signal 914 for one cycle of clock 608. This causes one of shift registers 902 to parallel load the contents of staging register 900 at time 1212. The identity of the shift register loaded will be determined by the state of decoded S. Adr bus 618, which is still valid at time 1212.

Type B Hierarchical Primary Node 210 (FIGS. 13–17)

Figure 13:
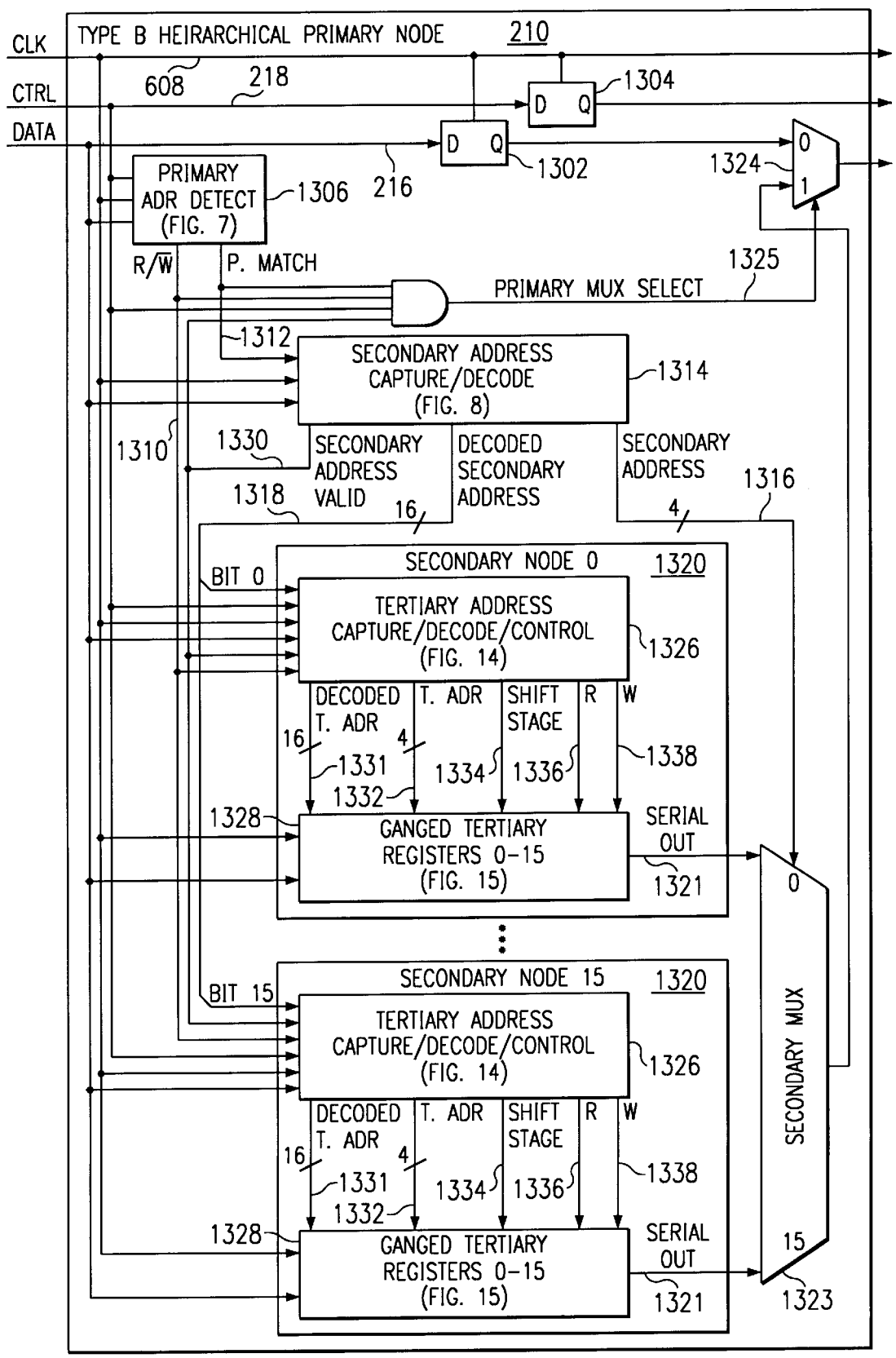
FIG. 13 is a schematic diagram illustrating a preferred implementation for the type B hierarchical primary node of FIG. 4.

An example implementation of type B hierarchical primary node 210 will now be described in detail with reference to FIGS. 13–17. Referring now to FIG. 13, hierarchical node 210 interposes a one-bit latency on serial data line 216 and control line 218 by virtue of storage cells 1302 and 1304, respectively. Primary address detect block 1306 is coupled to serial data line 216, control line 218 and clock signal 608, and is constructed as shown in FIG. 7. Primary address detect block 1306 generates R/W signal 1310 and primary match ("PMatch") signal 1312 as outputs. Secondary address capture/decode block 1314 is coupled to serial data line 216, clock signal 608 and PMatch signal 1312, and is constructed as shown in FIG. 8. Secondary address capture/decode block 1314 generates secondary address valid ("S. Adr Valid") signal 1330 and drives secondary address ("S.Adr") bus 1316 and decoded secondary address ("decoded S.Adr") bus 1318. Type B hierarchical node 210 includes 16 secondary nodes 1320. Each secondary node 1320 has a serial out line 1321 which is coupled to a corresponding input of secondary multiplexer 1323. The output of secondary multiplexer 1323 is coupled to the "1" data input of primary multiplexer 1324, as shown. Each of secondary nodes 1320 contains a tertiary address capture/ decode/control block 1326 and a ganged tertiary registers block 1328. Each of tertiary address capture/decode/control blocks 1326 is coupled to one of the bits of decoded S. Adr bus 1318. In addition, each of blocks 1326 is coupled to clock 608, data line 216, control 218, S. Adr valid signal 1330 and R/W̄ signal 1310. Each of tertiary address capture/decode/control blocks 1326 has the following outputs: decoded tertiary address ("decoded T. Adr") bus 1331, tertiary address ("T. Adr") bus 1332, shift stage signal 1334, read ("R") signal 1336 and write ("W") signal 1338. Each of these outputs is coupled to a corresponding input on the associated ganged tertiary registers block 1328. Each of ganged tertiary registers blocks 1328 is also coupled to clock 608 and data line 216. Each of ganged tertiary registers blocks 1328 generates one of serial out signals 1321.

Figure 14:
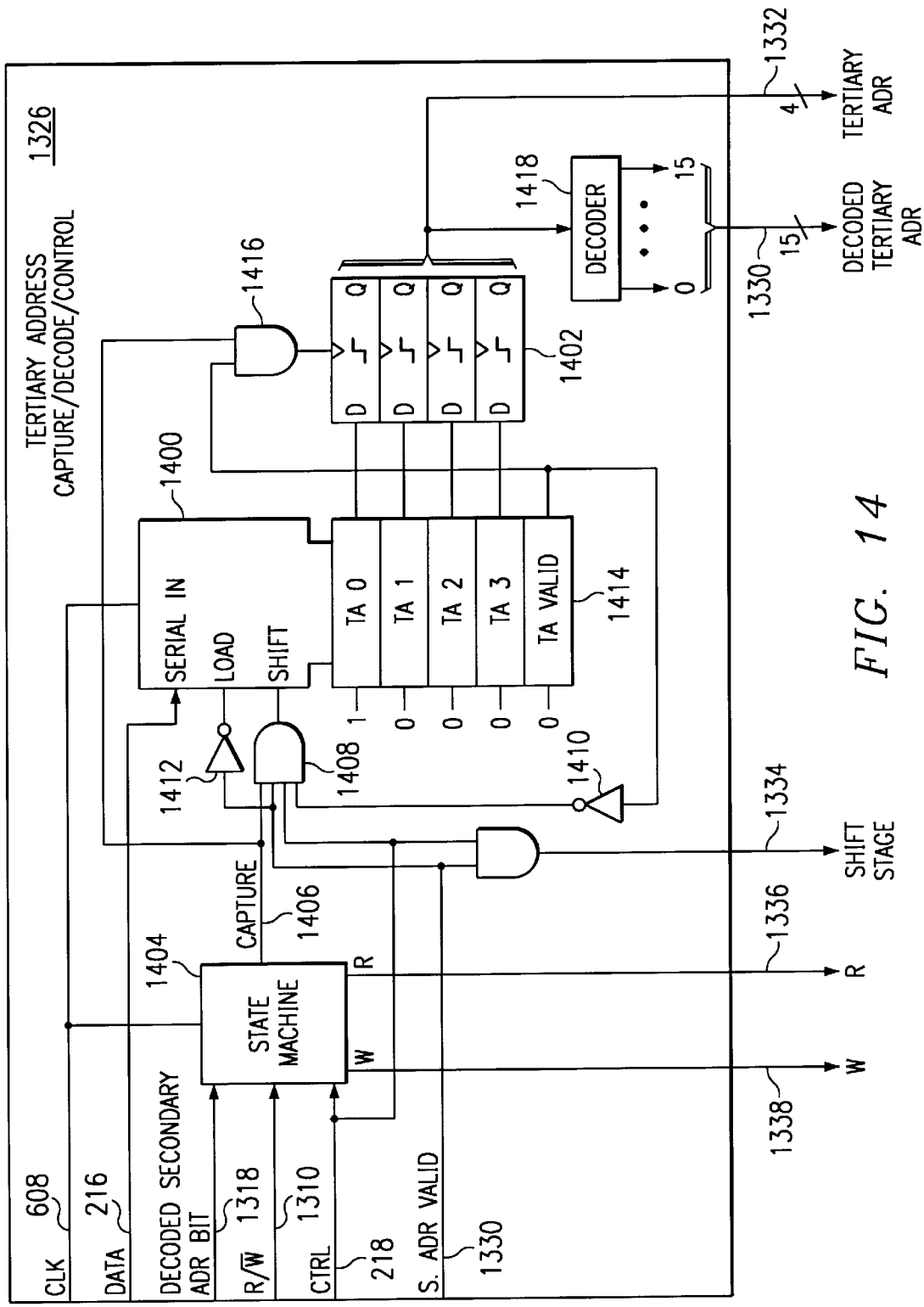
FIG. 14 is a schematic diagram illustrating a preferred implementation for the tertiary address capture/decode/control blocks of FIGS. 13 and 18.

FIG. 14 illustrates tertiary address capture/decode/control blocks 1326 in detail. The purpose of shift register 1400 and shadow register 1402 is to capture the tertiary address bits occurring in a packet and, in the case of a multi-cycle read or write operation, to hold those bits until the end of the last cycle in the operation. The purpose of state machine 1404 is to assert R signal 1336, W signal 1338 and capture signal 1406 at the proper times to effect this result. The implementation of state machine 1404 will be straightforward to persons having ordinary skill in the art and having reference to this discussion and FIGS. 16 and 17. Shift register 1400 loads "10000" whenever S. Adr valid signal 1330 is low (see inverter 1412). After this initialization, whenever S. Adr. valid signal 1330, control 218 and capture are all high, shift register 1400 clocks in 4 bits of tertiary address from data line 216 and then stops (see AND gate 1408 and inverter 1410). As soon as the fourth address bit has been clocked in, tertiary address valid ("TA valid") bit 1414 goes high. At the moment when TA valid bit 1414 goes high, shadow register 1402 is triggered to save the address bits just clocked in (see AND gate 1416). The four bits so saved are used to drive T. Adr bus 1332 and are fed to 4:16 decoder 1418, which drives decoded T. Adr bus 1331.

Figure 15:
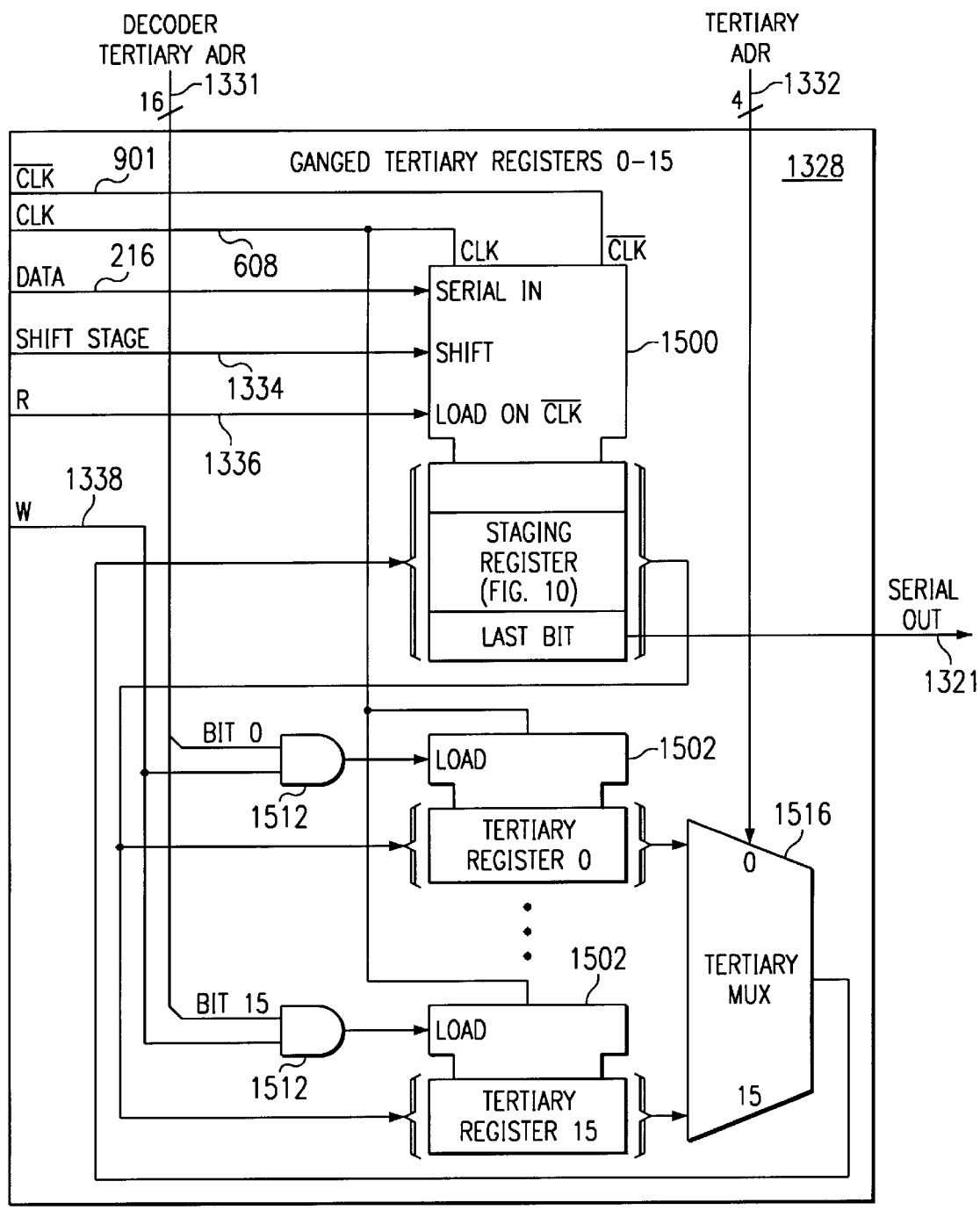
FIG. 15 is a schematic diagram illustrating a preferred implementation for the ganged tertiary registers blocks of FIGS. 13 and 18.

FIG. 15 illustrates ganged tertiary registers blocks 1328 in detail. Staging register 1500 is constructed as shown in FIG. 10. It has a first clock input coupled to clock signal 608 and a second clock input coupled to c̄l̄k̄ signal 901 (the inverse of clock signal 608). It has a serial data input coupled to serial data line 216 and a "load on c̄l̄k̄" input coupled to R signal 1336. The shift input of staging register 1500 is coupled to shift stage signal 1334. Serial out 1321 is taken from the last bit of staging register 1500. Tertiary registers 0–15 are implemented with sixteen conventional shift registers 1502, as shown. Each shift register 1502 has its clock input coupled to clock signal 608. Each has a load input that is coupled to the output of an AND gate 1512. Each of AND gates 1512 determines the logical AND of W signal 1338 and one of the decoded T. Adr bits 1331.

The parallel data load inputs of all shift registers 1502 are coupled to the parallel data outputs of staging register 1500. Thus, whenever W signal 1338 is high, the contents of staging register 1500 are loaded into one of shift registers 1502 synchronous with clock 608. The identity of the shift register so loaded is determined by the state of decoded T. Adr bus 1331. The parallel data load inputs of staging register 1500 are coupled to the output of tertiary multiplexer ("mux") 1516. Each of the data inputs of tertiary mux 1516 is coupled to the output of one of shift registers 1502. The data selected for output on tertiary mux 1516 is determined by the state of T. Adr bus 1332. When R signal 1336 is high, the contents of one of shift registers 1502 will be loaded into staging register 1500 synchronous with c̄l̄k̄ 901. The identity of the shift register whose contents are loaded into staging register 1500 is determined by the state of T. Adr bus 1332.

Figure 16:
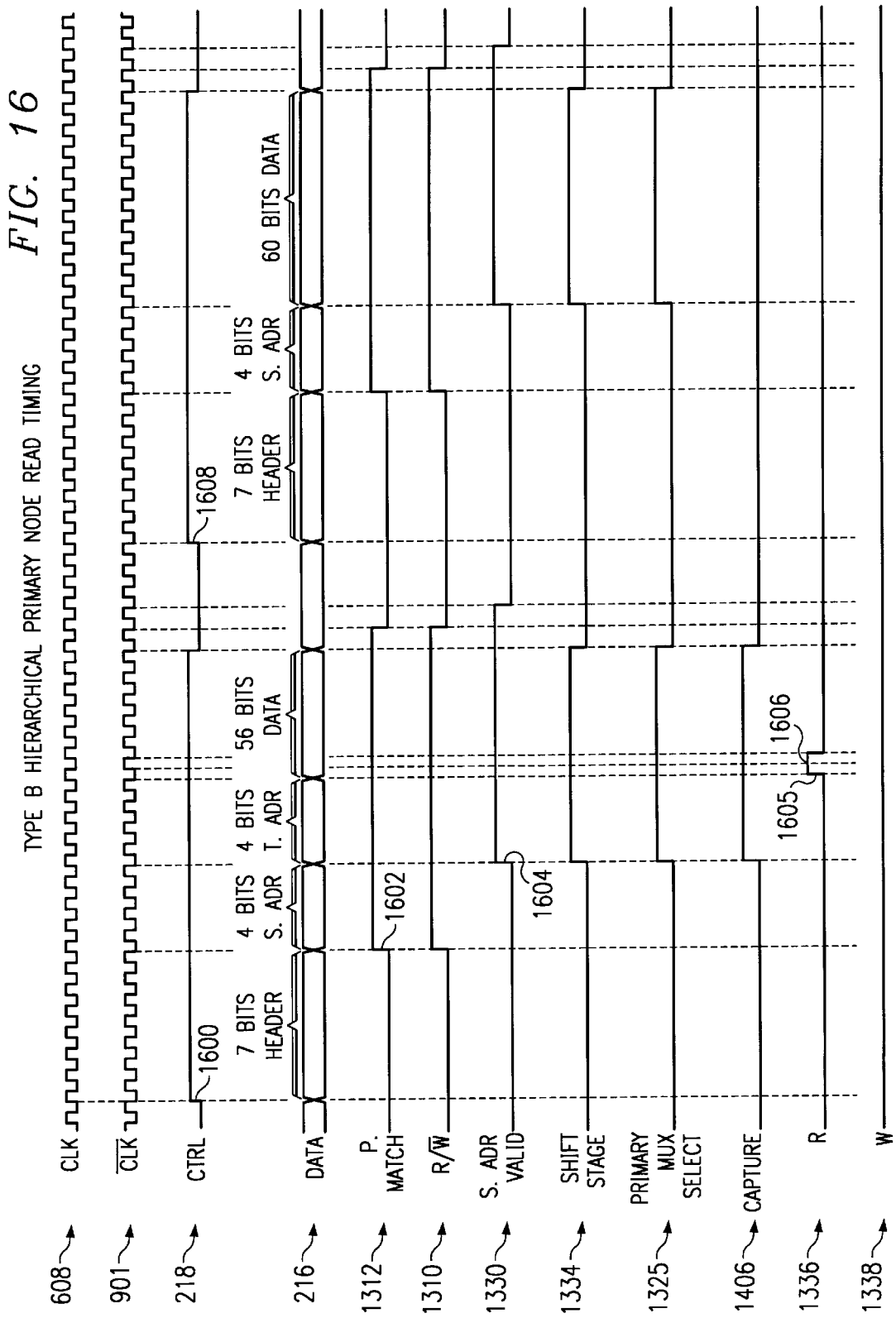
FIG. 16 is a timing diagram illustrating preferred read timing for the type B hierarchical primary node of FIG. 13.

For a case in which two cycles are required to access an oversized secondary register, FIG. 16 illustrates preferred read timing for type B hierarchical node 210. Microprocessor instructions are used to prepare a header generation register and a staging register within block 202 for each of the two cycles. Prior to beginning cycle 1, the primary address corresponding to primary node 210 is placed in the header generation register within block 202. The secondary address corresponding to the secondary node containing the tertiary register sought to be read (the "source register") is placed in the first four bits of the staging register within block 202. The tertiary address of the source register is placed in the four bits immediately following the secondary address. After this initialization, only 56 bits of data carrying capacity remain in the packet for cycle 1. (By way of contrast, in the teachings of the '609 patent, only the header of the packet carried an address. Thus, every packet was capable of carrying 64 bits of data.)

Cycle 1 begins with the assertion of control line 218 as shown at 1600. At the location of staging register block 202, the contents of the header generation register are shifted onto serial data line 216 during the 7 cycles of clock 608 that immediately follow the assertion of control line 218. At the location of primary node 210, these bits are shifted into primary address detect block 1306. As soon as the seventh header bit has been clocked in, PMatch 1312 becomes asserted as shown at 1602. Also, R/W̄ 1310 becomes asserted at this time because this cycle was setup as a read operation. At the location of staging register block 202, the contents of the staging register begin to be shifted onto serial data line 216 as soon as the last bit of the header generation register has been clocked out. Thus, the 4-bit secondary address immediately follows the 7-bit header, and the 4-bit tertiary address immediately follows the secondary address. At the location of primary node 210, the 4 bits of secondary address are shifted into secondary address capture/decode block 1314. S. Adr valid signal 1330 goes high immediately after the fourth secondary address bit has been clocked in, as shown at 1604. At that time, shift stage signal 1334 and primary mux select signal 1325 are asserted. (The first four bits of the data field returned in cycle 1 will be the secondary address bits, and the second four bits will be "garbage" bits.) Also at time 1604, state machine 1404 asserts capture signal 1406, which enables shifting in of the tertiary address bits by shift register 1400. As soon as the fourth tertiary address bit is shifted in, state machine 1404 asserts R signal 1336 for one cycle of clock 608, as shown at 1605. Because of the special design of staging register 1500, this causes a parallel load at time 1606. Shift stage 1334 and primary mux select 1325 will remain high for the next 56 cycles of clock 608. The result will be that 56 bits from newly-loaded staging register 1500 will be clocked onto data line 216 via secondary mux 1323 and primary mux 1324. Moreover, this is done in a manner that preserves the timing integrity of the 71-bit packet corresponding to cycle 1.

An arbitrary amount of time after cycle 1 ends, cycle 2 begins with another assertion of control signal 218 as shown at 1608. As was the case in the example of FIG. 11, R signal 1336 is never asserted during cycle 2. This is because staging register 1500 need only be parallel loaded once at the beginning of a multi-cycle read operation. Thereafter, its contents are merely shifted until all of the bits have been clocked onto data line 216. Unlike the example of FIG. 11, cycle 2 of FIG. 16 is not otherwise identical with cycle 1:

The tertiary address bits are presented on data line 216 only in the first cycle of a multi-cycle operation. To make this possible, at the location of hierarchical node 210, the tertiary address is assumed to be the same on the second and subsequent cycles of a multi-cycle operation. Thus, the programmer must exercise care in setting up and completing each of the expected cycles properly, so as not to "confuse" the remote circuitry by aborting a mutli-cycle operation and beginning a new operation without completing the previous one. The benefit of designing the protocol in this way is that 60 bits become available for payload in the second and subsequent cycles of a multi-cycle operation. (The reason why the secondary address bits must be retransmitted with each cycle will become apparent during the discussion below of type C hierarchical node 212.) Because the tertiary address bits are not retransmitted in cycle 2, no "garbage" bits are returned in cycle 2; only valid data bits. The effect of the two-cycle read operation just described is that 56 bits of data are read from the selected tertiary register during cycle 1, and 60 bits are read during cycle 2, for a total of 116 bits. After each cycle, it is up to the programmer to retrieve the correct bits from the data field in staging register block 202.

Figure 17:
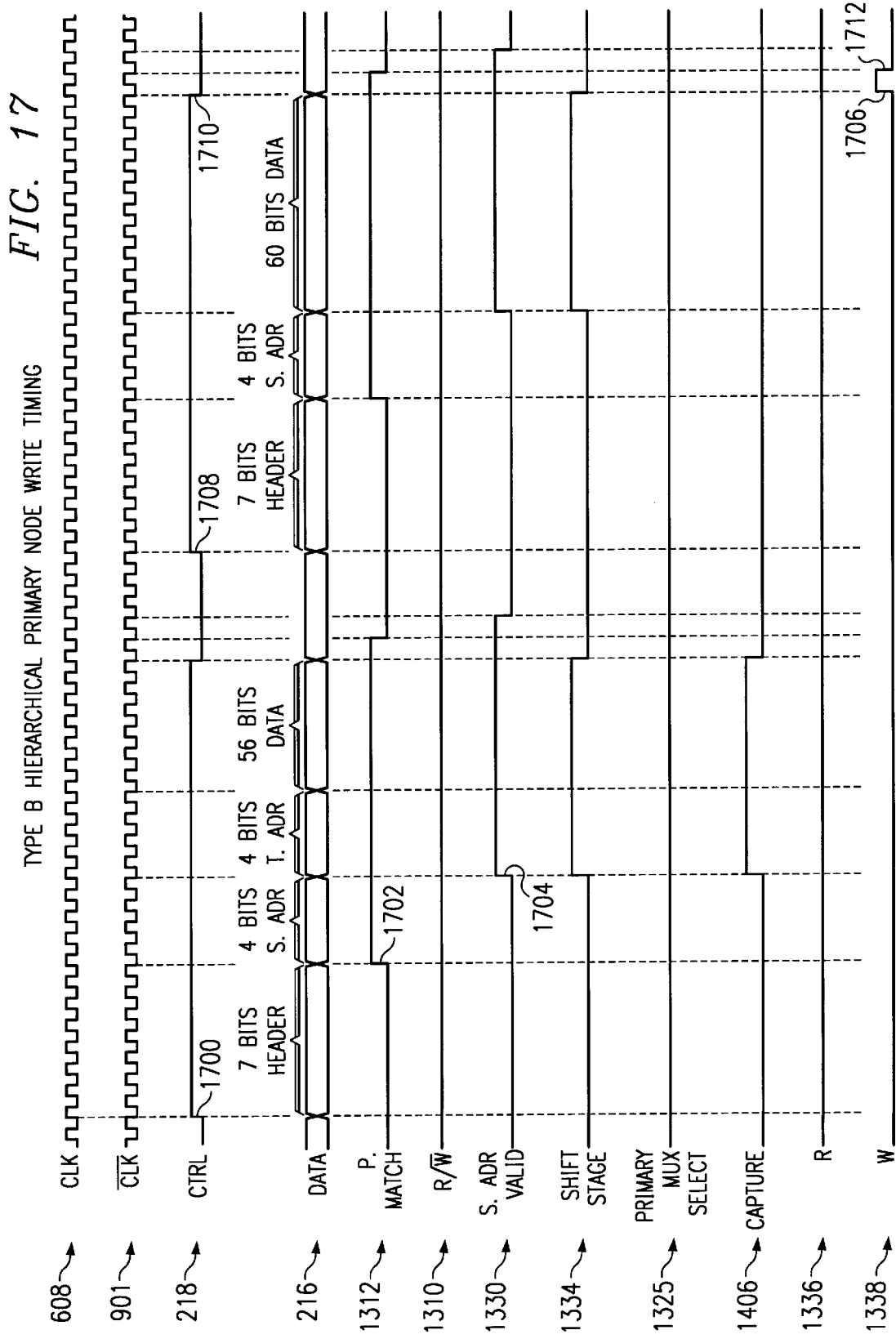
FIG. 17 is a timing diagram illustrating preferred write timing for the type B hierarchical primary node of FIG. 13.

FIG. 17 illustrates preferred write timing for type B hierarchical node 210. Like the example of FIG. 16, the example of FIG. 17 is also for a case in which two cycles are required to access an oversized tertiary register. Microprocessor instructions are used to prepare the header generation register and the staging register within block 202 for each of the two cycles. Prior to beginning cycle 1, the primary address corresponding to primary node 210 is placed in the header generation register within block 202. The secondary address corresponding to the secondary node containing the tertiary register sought to be written (the "target register") is placed in the first four bits of the staging register within block 202, and the tertiary address corresponding to the target register is placed in the next four bits. After this initialization, only 56 bits of data carrying capacity remain in the packet for cycle 1.

There are only two noteworthy differences between the write timing of FIG. 17 and the read timing of FIG. 16. First, in FIG. 17, neither the R/$\overline{\text{W}}$ signal 1310 nor the R signal 1336 are asserted at any time. This is because the timing of FIG. 17 depicts a write operation, not a read operation. Second, a one-cycle pulse occurs on W signal 1338 at time 1706. This pulse serves the same purpose in the example of FIG. 17 as it did in the example of FIG. 12: At the end of the second cycle, the contents of staging register 1500 will be loaded into the one tertiary register that was selected by the tertiary address bits. The one-cycle pulse on W signal 1338 at time 1706 accomplishes this transfer of the contents of staging register 1500 into the selected tertiary register.

Cycle 1 begins with the assertion of control line 218 as shown at 1700. At the location of staging register block 202, the contents of the header generation register are shifted onto serial data line 216 during the 7 cycles of clock 608 that immediately follow the assertion of control line 218. At the location of primary node 210, these bits are shifted into block 1306. As soon as the seventh header bit has been clocked in, PMatch 1312 becomes asserted as shown at 1702. At the location of staging register block 202, the contents of the staging register begin to be shifted onto serial data line 216 as soon as the last bit of the header generation register has been clocked out. At the location of primary node 210, these 4 bits of secondary address are shifted into block 1314 because PMatch 1312 is now asserted. S. Adr valid signal 1330 goes high immediately after the fourth secondary address bit has been clocked in, as shown at 1704. As soon as S. Adr valid 1330 goes high, capture 1406 goes high, enabling the tertiary address bits to be shifted into shift register 1400. Because shift stage 1334 is asserted at time 1704, four unwanted bits will be shifted into staging register 1500 during cycle 1 (analogous to the "garbage" bits described above). These tertiary address bits are not problematic, however, as they will simply be shifted out of staging register 1500 prior to the transfer of staging register 1500 contents into the target tertiary register. Once the fourth tertiary address bit has been shifted into shift register 1400, the tertiary address is saved as described above. Following the tertiary address bits, 56 data bits are clocked into staging register 1500 during cycle 1 prior to control 218 going low.

An arbitrary amount of time after cycle 1 ends, cycle 2 begins with another assertion of control signal 218 as shown at 1708. Cycle 2 then proceeds in a manner identical with that of cycle 1, except that the tertiary address bits are not retransmitted. The aggregate result will be that 116 data bits will have been shifted into staging register 1500 by time 1710. Immediately after control 218 goes low at time 1710 signifying the end of cycle 2, state machine 1404 asserts W signal 1338 for one cycle of clock 608. This causes one of shift registers 1502 to parallel load the contents of staging register 1500 at time 1712. The identity of the shift register loaded will be determined by the state of decoded T. Adr bus 1332, which is still valid at time 1712.

Figure 18:
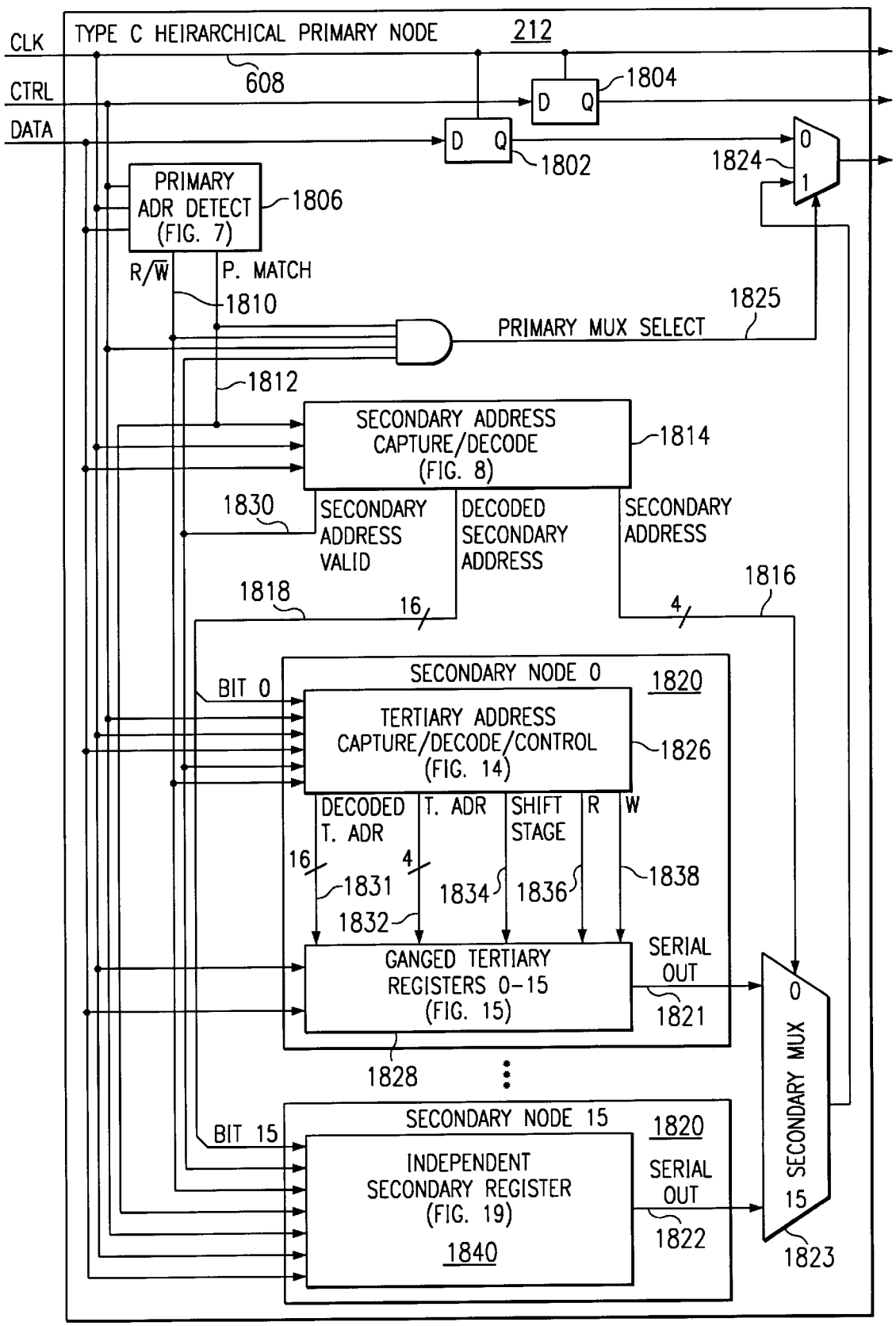
FIG. 18 is a schematic diagram illustrating a preferred implementation for the type C hierarchical primary node of FIG. 5.
Figure 19:
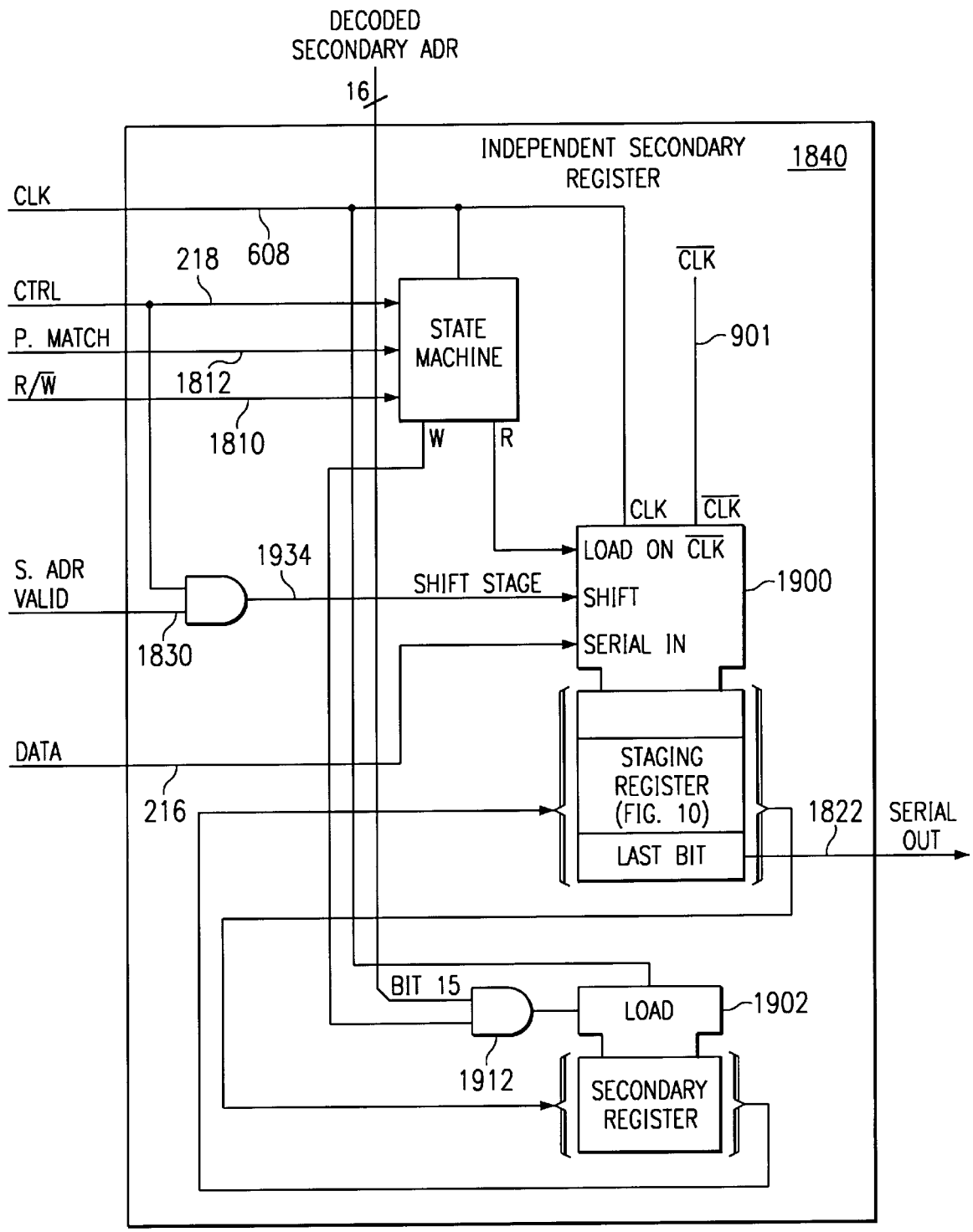
FIG. 19 is a schematic diagram illustrating a preferred implementation for the independent secondary register block of FIG. 18.

Type C Hierarchical Primary Node 212 (FIGS. 18–19)

An example implementation of type C hierarchical primary node 212 will now be described in detail with reference to FIGS. 18–19. Referring now to FIG. 18, hierarchical node 212 interposes a one-bit latency on serial data line 216 and control line 218 by virtue of storage cells 1802 and 1804, respectively. Primary address detect block 1806 is coupled to serial data line 216, control line 218 and clock signal 608, and is constructed as shown in FIG. 7. Primary address detect block 1806 generates R/$\overline{\text{W}}$ signal 1810 and primary match ("PMatch") signal 1812 as outputs. Secondary address capture/decode block 1814 is coupled to serial data line 216, clock signal 608 and PMatch signal 1812, and is constructed as shown in FIG. 8. Secondary address capture/decode block 1814 generates secondary address valid ("S. Adr Valid") signal 1830 and drives secondary address ("S.Adr") bus 1816 and decoded secondary address ("decoded S.Adr") bus 1818.

Type C hierarchical node 212 includes 16 secondary nodes 1820. Each secondary node 1820 has a serial out line (as shown at 1821 and 1822) which is coupled to a corresponding input of secondary multiplexer 1823. The output of secondary multiplexer 1823 is coupled to the "1" data input of primary multiplexer 1824, as shown. As was described above in the context of FIG. 5, some of secondary nodes 1820 contain a set of tertiary registers; others contain only a single independent secondary register. Those that contain a set of tertiary registers, such as secondary node 0 in FIG. 18, are constructed exactly like the secondary nodes of FIG. 13. Those that contain only an independent secondary register, such as node 15 in FIG. 18, will be described in detail with reference to FIG. 19. In all other respects, type C hierarchical node 212 is the same as type B hierarchical node 210.

FIG. 19 illustrates independent secondary register block 1840 in detail. As is apparent from the drawing, block 1840 is merely a simplified version of ganged secondary register block 620. Because only one secondary register 1902 is present in block 1840, no secondary multiplexer is required. In all other respects, block 1840 is identical to block 620. Therefore, its construction will not be discussed further herein. When accessing a tertiary register within type C hierarchical node 212, the preferred read timing is the same as that shown in FIG. 16, and the preferred write timing is the same as that shown in FIG. 17. When accessing an independent secondary register within type C hierarchical node 212, the preferred read timing is the same as that shown in FIG. 11, and the preferred write timing is the same as that shown in FIG. 12.

Conclusion

While the invention has been described in detail in relation to a preferred embodiment thereof, the described embodiment has been presented by way of example and not by way of limitation. It will be understood by those skilled in the art that various changes may be made in the form and details of the described embodiment, resulting in alternative embodiments that remain within the scope of the appended claims.

For example, although FIGS. 9, 15 and 19 of the illustrated embodiment all teach the use of a staging register for parallel loading of the secondary or tertiary registers, in other embodiments these staging registers may be omitted and the secondary or tertiary registers loaded serially.

In addition, the concept of secondary nodes and tertiary registers may be expanded in further implementations to include tertiary nodes, quaternary registers, and so on. In such implementations, quaternary and further addresses may be placed in the data field of the standard packet immediately after the tertiary address bits, thus maintaining the advantages taught herein: Additional remote registers may be accessed without changing the length of the header address field of the standard packet; one bit of latency need not be added to the packet loop for every additional register so added; and the newly-added hierarchical nodes will be downward compatible with any already-existing conventional nodes.

What is claimed is:

1. A system of registers implemented on an integrated circuit chip, comprising:
   a plurality of primary nodes configured in series along a serial data line, each of the plural primary nodes individually selectable according to a primary address presented on the serial data line;
   wherein a hierarchical one of the plural primary nodes comprises:
      a plurality of registers, each of the plural registers individually selectable according to a secondary address presented on the serial data line;
      read circuitry for coupling data from a selected one of the plural registers to the serial data line during a read operation; and
      write circuitry for coupling data from the serial data line to the selected one of the plural registers during a write operation.

2. The system of registers according to claim 1, wherein the hierarchical one of the plural primary nodes further comprises:
   primary address detection circuitry for comparing the primary address with a first predetermined address and generating a primary match indicator if the primary address corresponds to the first predetermined address;
   secondary address capture circuitry for capturing the secondary address from the serial data line responsive to the primary match indicator; and
   decoder circuitry for selecting one of the plural registers responsive to the captured secondary address.

3. The system of registers according to claim 1, wherein at least one of the plural primary nodes is non-hierarchical and comprises a single register selectable according to the primary address.

4. A system of registers implemented on an integrated circuit chip, comprising:
   a plurality of primary nodes configured in series along a serial data line, each of the plural primary nodes individually selectable according to a primary address presented on the serial data line;
   wherein a hierarchical one of the plural primary nodes comprises a plurality of secondary nodes, each of the plural secondary nodes individually selectable according to a secondary address presented on the serial data line;
   wherein at least one of the plural secondary nodes comprises:
      a plurality of registers, each of the plural registers individually selectable according to a tertiary address presented on the serial data line;
      read circuitry for coupling data from a selected one of the plural registers to the serial data line during a read operation; and
      write circuitry for coupling data from the serial data line to the selected one of the plural registers during a write operation.

5. The system of registers according to claim 4, wherein the hierarchical one of the plural primary nodes further comprises:
   primary address detection circuitry for comparing the primary address with a first predetermined address and generating a primary match indicator if the primary address corresponds to the first predetermined address;
   secondary address capture circuitry for capturing the secondary address from the serial data line responsive to the primary match indicator; and
   secondary address decoder circuitry for selecting one of the plural secondary nodes responsive to the captured secondary address.

6. The system of registers according to claim 5, wherein at least one of the plural secondary nodes further comprises:
   tertiary address capture circuitry for capturing the tertiary address from the serial data line responsive to the secondary address decoder circuitry; and
   tertiary address decoder circuitry for selecting one of the plural registers responsive to the captured tertiary address.

7. The system of registers according to claim 4, wherein at least one of the plural primary nodes is non-hierarchical and comprises a single register selectable according to the primary address.

8. A method of writing data to a register on an integrated circuit chip, comprising the steps of:
   in a first cycle:
      presenting a primary address on a serial data line, the primary address for selecting a target primary node out of a plurality of primary nodes configured in series along the serial data line;
      presenting a secondary address on the serial data line, the secondary address for selecting a target register out of a plurality of registers associated with the target primary node; and presenting first data on the serial data line to be written into the target register.

9. The method of writing data to a register according to claim 8, further comprising the steps of:

in a second cycle:

presenting the primary address on the serial data line, the primary address for again selecting the target primary node;

presenting the secondary address on the serial data line, the secondary address for again selecting the target register; and presenting second data on the serial data line to be written into the target register.

10. The method of writing data to a register according to claim 8, further comprising the steps of:

shifting the first data into a staging register; and loading the first data from the staging register into the target register.

11. The method of writing data to a register according to claim 9, further comprising the steps of:

in the first cycle, shifting the first data into a staging register;

in the second cycle, shifting the second data into the staging register; and loading the first and second data from the staging register into the target register.

12. A method of writing data to a register on an integrated circuit chip, comprising the steps of:

in a first cycle:

presenting a primary address on a serial data line, the primary address for selecting a target primary node out of a plurality of primary nodes configured in series along the serial data line;

presenting a secondary address on the serial data line, the secondary address for selecting a target secondary node out of a plurality of secondary nodes associated with the target primary node;

presenting a tertiary address on the serial data line, the tertiary address for selecting a target register out of a plurality of registers associated with the target secondary node; and presenting first data on the serial data line to be written into the target register.

13. The method of writing data to a register according to claim 12, further comprising the steps of:

in a second cycle:

presenting the primary address on the serial data line, the primary address for again selecting the target primary node; and presenting the secondary address on the serial data line, the secondary address for again selecting the target secondary node; and presenting second data on the serial data line to be written into the target register.

14. The method of writing data to a register according to claim 12, further comprising the steps of:

shifting the first data into a staging register; and loading the first data from the staging register into the target register.

15. The method of writing data to a register according to claim 13, further comprising the steps of:

in the first cycle, shifting the first data into a staging register;

in the second cycle, shifting the second data into the staging register; and loading the first and second data from the staging register into the target register.

16. A method of reading data from a register on an integrated circuit chip, comprising the steps of:

in a first cycle:

at a first location, presenting a primary address on a serial data line, the primary address for selecting a target primary node out of a plurality of primary nodes configured in series along the serial data line;

at the first location, presenting a secondary address on the serial data line, the secondary address for selecting a target register out of a plurality of registers associated with the target primary node; and at a second location, presenting first data from the target register on the serial data line.

17. The method of reading data from a register according to claim 16, further comprising the steps of:

in a second cycle:

at the first location, presenting the primary address on the serial data line, the primary address for again selecting the target primary node; and at the first location, presenting the secondary address on the serial data line, the secondary address for again selecting the target register; and at the second location, presenting second data from the target register on the serial data line.

18. The method of reading data from a register according to claim 16, further comprising the steps of:

loading the first data from the target register into a staging register; and shifting the first data from the staging register onto the serial data line.

19. The method of reading data from a register according to claim 17, further comprising the steps of:

in the first cycle, loading the first and second data from the target register into a staging register and shifting the first data from the staging register onto the serial data line; and in the second cycle, shifting the second data from the staging register onto the serial data line.

20. A method of reading data from a register on an integrated circuit chip, comprising the steps of:

in a first cycle:

at a first location, presenting a primary address on a serial data line, the primary address for selecting a target primary node out of a plurality of primary nodes configured in series along the serial data line;

at the first location, presenting a secondary address on the serial data line, the secondary address for selecting a target secondary node out of a plurality of secondary nodes associated with the target primary node;

at the first location, presenting a tertiary address on the serial data line, the tertiary address for selecting a target register out of a plurality of registers associated with the target secondary node; and at a second location, presenting first data from the target register on the serial data line.

21. The method of reading data from a register according to claim 20, further comprising the steps of:

in a second cycle:

at the first location, presenting the primary address on the serial data line, the primary address for again selecting the target primary node;

at the first location, presenting the secondary address on the serial data line, the secondary address for again selecting the target secondary node; and at the second location, presenting second data from the target register on the serial data line.

22. The method of reading data from a register according to claim 20, further comprising the steps of:

loading the first data from the target register into a staging register; and shifting the first data from the staging register onto the serial data line.

23. The method of reading data from a register according to claim 21, further comprising the steps of:

in the first cycle, loading the first and second data from the target register into a staging register and shifting the first data from the staging register onto the serial data line; and in the second cycle, shifting the second data from the staging register onto the serial data line.

* * * * *